United States Patent
Arvelo et al.

(10) Patent No.: US 9,265,177 B2
(45) Date of Patent: Feb. 16, 2016

(54) FABRICATING MULTI-COMPONENT ELECTRONIC MODULE WITH INTEGRAL COOLANT-COOLING

(71) Applicant: INTERNATIONAL BUSINESS MACHINES CORPORATION, Armonk, NY (US)

(72) Inventors: Amilcar R. Arvelo, Poughkeepsie, NY (US); Levi A. Campbell, Poughkeepsie, NY (US); Michael J. Ellsworth, Jr., Poughkeepsie, NY (US); Eric J. McKeever, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/528,098

(22) Filed: Oct. 30, 2014

(65) Prior Publication Data
US 2015/0055299 A1 Feb. 26, 2015

Related U.S. Application Data

(63) Continuation of application No. 13/790,241, filed on Mar. 8, 2013.

(51) Int. Cl.
*H05K 7/20* (2006.01)
*G06F 1/20* (2006.01)
(Continued)

(52) U.S. Cl.
CPC ............ *H05K 7/20281* (2013.01); *F28D 15/00* (2013.01); *G06F 1/20* (2013.01);
(Continued)

(58) Field of Classification Search
CPC . H05K 7/20; H05K 7/20309; H05K 7/20936; H05K 7/20455; H01L 23/34; H01L 23/473; H01L 23/4735; F28F 3/02; F28F 3/08; F28F 7/00; F28D 15/00; G06F 1/20
USPC ........................ 361/679.46, 679.53, 688, 689, 361/698–700, 715, 719; 165/80.2, 80.4, 165/80.5, 104.19, 104.33, 104.34, 185; 257/697, 686, 706–726; 174/15.1, 174/16.3, 254; 62/259.2
See application file for complete search history.

(56) References Cited

U.S. PATENT DOCUMENTS

| 4,138,692 A | * | 2/1979 | Meeker et al. ................. 257/697 |
| 4,245,273 A | | 1/1981 | Feinberg et al. |

(Continued)

FOREIGN PATENT DOCUMENTS

JP      05-21663 A      1/1993

OTHER PUBLICATIONS

Bakhru et al., "Enhanced Cooling of Thermal Conduction Module", IBM Technical Disclosure Bulletin, 10-87, p. 426; original publication date: Oct. 1, 1987 (IP.com doc: IPCOM000040334D; e-publication date: Feb. 2, 2005).

(Continued)

*Primary Examiner* — Michail V Datskovskiy
(74) *Attorney, Agent, or Firm* — Margaret A. McNamara, Esq.; Kevin P. Radigan, Esq.; Heslin Rothenberg Farley & Mesiti P.C.

(57) ABSTRACT

Methods for fabricating a coolant-cooled component assembly are provided, which include providing a multi-component assembly and a module lid with openings aligned over respective electronic components. Thermally conductive elements are disposed within the openings, each including opposite coolant-cooled and conduction surfaces, with the conduction surface being thermally coupled to the respective electronic component. A manifold assembly disposed over the module lid includes inner and outer manifold elements, with the inner element configured to facilitate flow of coolant onto the coolant-cooled surfaces. The outer manifold element is disposed over the inner manifold element and coupled to the module lid, with the inner and outer manifold elements defining a coolant supply manifold, and the outer manifold element and module lid defining a coolant return manifold. The coolant supply openings are in fluid communication with the coolant supply manifold, and the coolant exhaust channels are in fluid communication with the coolant return manifold.

19 Claims, 14 Drawing Sheets

(51) Int. Cl.
*H01L 23/34* (2006.01)
*F28D 15/00* (2006.01)
*H01L 23/367* (2006.01)
*H01L 23/473* (2006.01)
*H01L 21/48* (2006.01)

(52) U.S. Cl.
CPC ........... *H01L 21/4882* (2013.01); *H01L 23/34* (2013.01); *H01L 23/367* (2013.01); *H01L 23/473* (2013.01); *H01L 23/3675* (2013.01); *H01L 23/3677* (2013.01); *H01L 2924/0002* (2013.01)

(56) References Cited

U.S. PATENT DOCUMENTS

| | | | |
|---|---|---|---|
| 4,500,945 A | | 2/1985 | Lipshutz |
| 4,748,495 A | | 5/1988 | Kucharek |
| 4,759,403 A | * | 7/1988 | Flint et al. ............ 165/80.4 |
| 4,879,629 A | * | 11/1989 | Tustaniwskyj et al. ....... 361/699 |
| 4,942,497 A | | 7/1990 | Mine et al. |
| 5,098,609 A | | 3/1992 | Iruvanti et al. |
| 5,161,089 A | * | 11/1992 | Chu et al. ............ 361/703 |
| 5,177,667 A | | 1/1993 | Graham et al. |
| 5,239,200 A | | 8/1993 | Messina et al. |
| 5,269,372 A | | 12/1993 | Chu et al. |
| 5,294,830 A | | 3/1994 | Young et al. |
| 5,309,319 A | * | 5/1994 | Messina ............ 361/699 |
| 5,360,993 A | * | 11/1994 | Mine ............ 257/714 |
| 5,365,400 A | | 11/1994 | Ashiwake et al. |
| 5,390,076 A | | 2/1995 | Umezawa |
| 5,394,299 A | | 2/1995 | Chu et al. |
| 5,463,528 A | | 10/1995 | Umezawa |
| 6,351,384 B1 | | 2/2002 | Daikoku et al. |
| 6,404,638 B1 | | 6/2002 | Messina |
| 6,528,878 B1 | * | 3/2003 | Daikoku et al. ............ 257/714 |
| 6,778,393 B2 | | 8/2004 | Messina et al. |
| 6,892,801 B1 | | 5/2005 | Kim |
| 7,104,312 B2 | | 9/2006 | Goodson et al. |
| 7,298,617 B2 | * | 11/2007 | Campbell et al. ............ 361/699 |
| 7,298,618 B2 | * | 11/2007 | Campbell et al. ............ 361/699 |
| 7,808,781 B2 | * | 10/2010 | Colgan et al. ............ 361/699 |
| 7,826,228 B2 | | 11/2010 | Audet et al. |
| 7,836,597 B2 | | 11/2010 | Datta et al. |
| 7,849,914 B2 | | 12/2010 | Di Stefano et al. |
| 8,058,724 B2 | | 11/2011 | Refai-Ahmed |
| 2006/0002088 A1 | | 1/2006 | Bezama et al. |
| 2009/0284921 A1 | | 11/2009 | Colgan et al. |
| 2010/0328888 A1 | | 12/2010 | Campbell et al. |
| 2014/0254098 A1 | | 9/2014 | Arvelo et al. |

OTHER PUBLICATIONS

Arvelo et al., Notification of Transmittal of the International Search Report & the Written Opinion for PCT Application No. PCT/USIB2014/059084, dated Jun. 3, 2014 (9 pages).

Arvelo et al., Office Action for U.S. Appl. No. 13/790,241, filed Mar. 8, 2013 (U.S. Pat. No. 2014/0254098 A1), dated Feb. 20, 2015 (10 pages).

Arvelo et al., Office Action for U.S. Appl. No. 13/790,241, filed Mar. 8, 2013 (U.S. Pat. No. 2014/0254098 A1), dated Jul. 28, 2015 (8 pages).

* cited by examiner

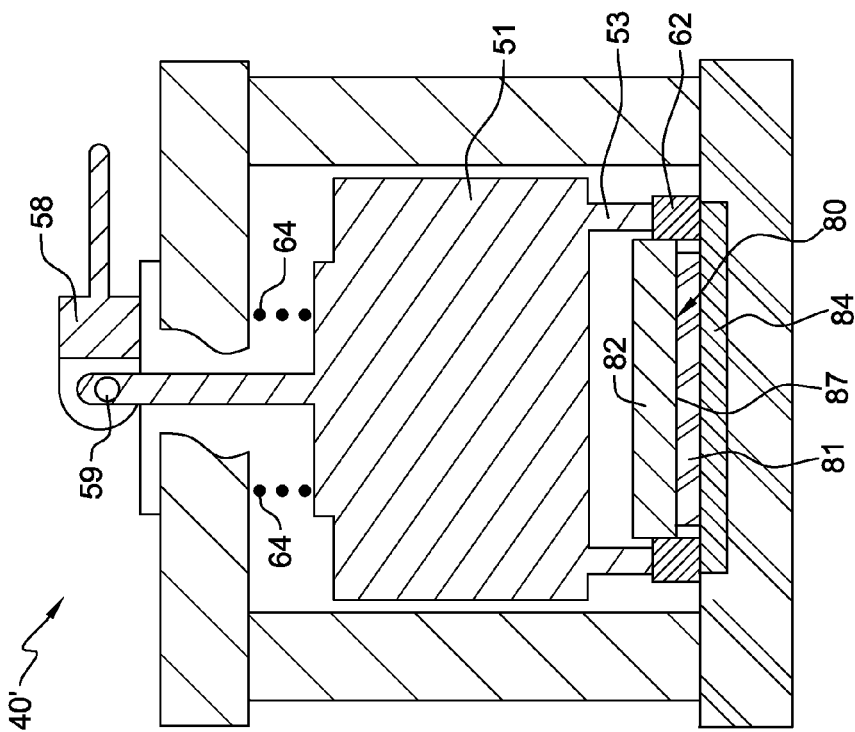
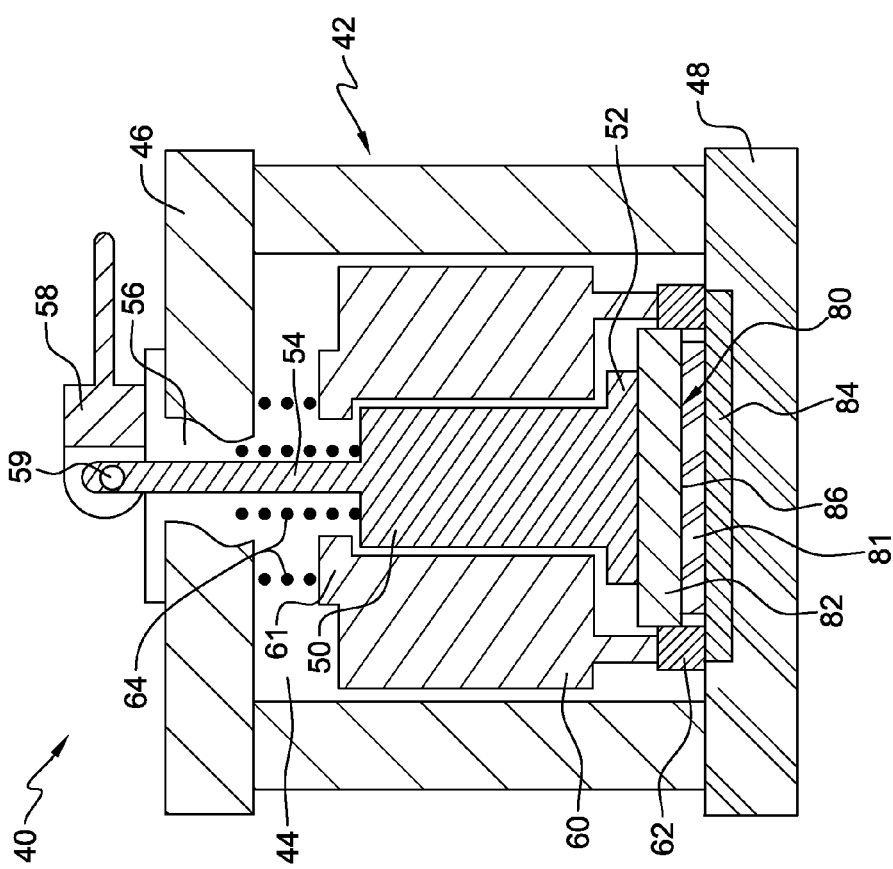

FABRICATING MULTI-COMPONENT ELECTRONIC MODULE WITH INTEGRAL COOLANT-COOLING

CROSS-REFERENCE TO RELATED APPLICATION

This application is a continuation of U.S. Ser. No. 13/790,241, filed Mar. 8, 2013, entitled "Multi-Component Electronic Module With Integral Coolant-Cooling", which was published Sep. 11, 2014, as U.S. Patent Publication No. 2014/0254098 A1, and which is hereby incorporated herein by reference in its entirety.

BACKGROUND

Modules including, for instance, multiple integrated circuit chips mounted in an array on a substrate present unique cooling challenges. While chip size has increased over time, and power usage is more efficient than in the past, work is still needed on cooling systems and methods to remove the ever-increasing, high-density power dissipated by the integrated circuit chips. Existing art is replete with different types of thermal conduction modules (TCMs) designed to enclose and cool integrated circuit chips mounted on, for instance, a substrate. In some instances, the TCMs utilize blocks or pistons contacting the electronic components within the TCMs to remove heat. See, for instance, U.S. Pat. No. 4,500,945, and U.S. Pat. No. 6,404,638 B1, assigned to the assignee of this application.

Another approach to cooling chips with TCMs has been to utilize a thermally conductive medium, such as high-thermal conductivity paste, between the top of the integrated circuit chip mounted to the substrate and the lower surface of the cover plate facing the substrate. An example of the use of a stable, high-solid content, high-thermal conductivity paste is disclosed in U.S. Pat. No. 5,098,609. This compound can be applied as a thin film between the top of the chip and the lower surface of the cover of the TCM. In order to properly control the amount of heat removed from the integrated circuit chip, however, it is desirable to determine a gap of a specified and desired fixed distance between the top of the chip and the lower surface of the cover, and to fill that space completely with the thermally conductive medium, such as the aforementioned paste. This is discussed further in U.S. Pat. No. 6,404,638, which is also assigned to the assignee of this application.

BRIEF SUMMARY

In one aspect, provided herein is a method which includes: providing a multi-component assembly comprising multiple electronic components disposed on a substrate; providing a module lid assembly, the module lid assembly including a module lid having multiple openings through the module lid aligned over the multiple electronic components of the multi-component assembly, and multiple thermally conductive elements disposed within the multiple openings in the module lid, one thermally conductive element of the multiple thermally conductive elements comprising a coolant-cooled surface and a conduction surface, the coolant-cooled surface and the conduction surface being opposite surfaces of the one thermally conductive element, and the conduction surface being thermally coupled via a thermal conduction path to one electronic component of the multiple electronic components of the multi-component assembly; disposing an inner manifold element over the lid assembly, the inner manifold element comprising opposite first and second main surfaces, the first main surface being configured to facilitate flow of coolant onto, at least in part, the coolant-cooled surface of the one thermally conductive element, and including a coolant supply opening disposed over the coolant-cooled surface of the one thermally conductive element, and a coolant exhaust channel disposed, at least in part, adjacent to the coolant-cooled surface of the one thermally conductive element; and disposing an outer manifold element over the inner manifold element and coupled to the module lid, with the inner manifold element between the outer manifold element and the module lid, wherein the inner manifold element and the outer manifold element define, at least in part, a coolant supply manifold over the second main surface of the inner manifold element, and the outer manifold element and the module lid define, at least in part, a coolant return manifold, the coolant supply opening being in fluid communication with the coolant supply manifold, and the coolant exhaust channel being in fluid communication with the coolant return manifold, and the coolant supply manifold, coolant supply opening, coolant exhaust channel, and coolant return manifold, facilitate flow of coolant across the coolant-cooled surface of the one thermally conductive element.

Further, a method is provided herein which includes providing a coolant-cooled electronic module, the providing including: providing a multi-component assembly comprising multiple electronic components disposed on a substrate; providing a module lid assembly, the module lid assembly comprising; a module lid including multiple openings through the module lid aligned over the multiple electronic components of the multi-component assembly, and multiple thermally conductive elements disposed within the multiple openings in module lid, one thermally conductive element of the multiple thermally conductive elements comprising a coolant-cooled surface and a conduction surface, the coolant-cooled surface and the conduction surface being opposite surfaces of the one thermally conductive element, the conduction surface being thermally coupled via a thermal conduction path to one electronic component of the multiple electronic components of the multi-component assembly; and providing a manifold assembly configured to facilitate coolant flow across the coolant-cooled surface of the one thermally conductive element. The manifold assembly includes: an inner manifold element disposed over the lid assembly, the inner manifold element comprising opposite first and second main surfaces, the first main surface being configured to facilitate flow of coolant onto, at least in part, the coolant-cooled surface of the one thermally conductive element, and including a coolant supply opening disposed over the coolant-cooled surface of the one thermally conductive element, and a coolant exhaust channel disposed, at least in part, adjacent to the coolant-cooled surface of the one thermally conductive element; and an outer manifold element disposed over the inner manifold element and coupled to the module lid, with the inner manifold element between the outer manifold element and the module lid, wherein the inner manifold element and the outer manifold element define, at least in part, a coolant supply manifold over the second main surface of the inner manifold element, and the outer manifold element and module lid define, at least in part, a coolant return manifold, the coolant supply opening being in fluid communication with the coolant supply manifold, and the coolant exhaust channel being in fluid communication with the coolant return manifold, and the coolant supply manifold, coolant supply opening, coolant exhaust channel, and coolant return manifold facilitate flow of coolant across the coolant-cooled surface of the one thermally conductive element.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 2A is a cross-sectional view of an apparatus for deploying a thermal conduction module, while in deployment, in accordance with one or more aspects of the present invention;

FIG. 2B is a cross-sectional view of another apparatus for deploying a thermal conduction module, after deployment, in accordance with one or more aspects of the present invention;

DETAILED DESCRIPTION

Aspects of the present invention and certain features, advantages, and details thereof, are explained more fully below with the reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Note also that reference is made below to the drawings, which are not drawn to scale for ease of understanding, wherein the same reference numbers used throughout different figures designate the same or similar components.

Initially, FIGS. 1A-5 describe examples of small gap technology (SGT) processing, wherein a thermal conduction module (TCM), comprising one or more thermally conductive elements set at a fixed distance to a respective surface of one or more electronic components to be cooled, is discussed. In this discussion, the thermally conductive elements are thermally conductive blocks or plugs fabricated of, for instance, a highly thermally conductive material, such as a metal. FIGS. 6-9C depict enhanced embodiments of a coolant-cooled electronic module or thermal conduction module, in accordance with one or more aspects of the present invention. In these enhanced embodiments, a manifold assembly is provided to establish direct liquid-cooling of the thermally conductive elements that are in thermal contact with the electronic components of the multi-component assembly, for instance, contacted via SGT fabrication processing.

Figure 1A:
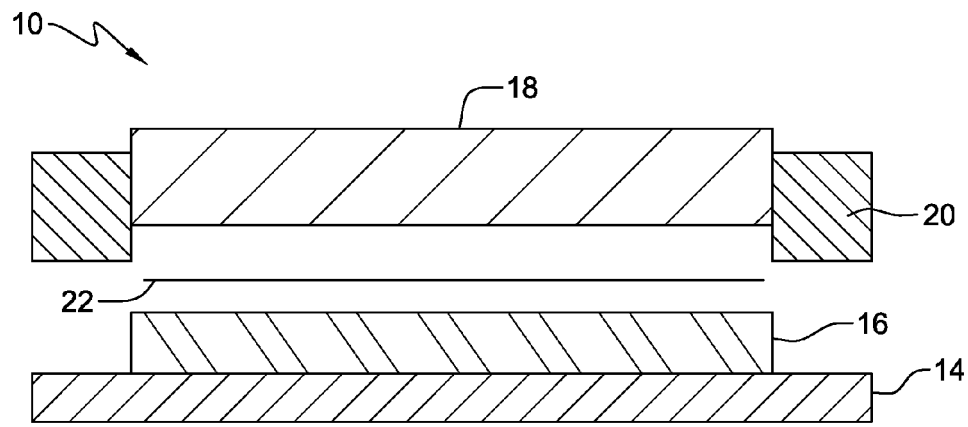
FIG. 1A is a cross-sectional view of a thermal conduction module assembly kit, in accordance with one or more aspects of the present invention.
Figure 1B:
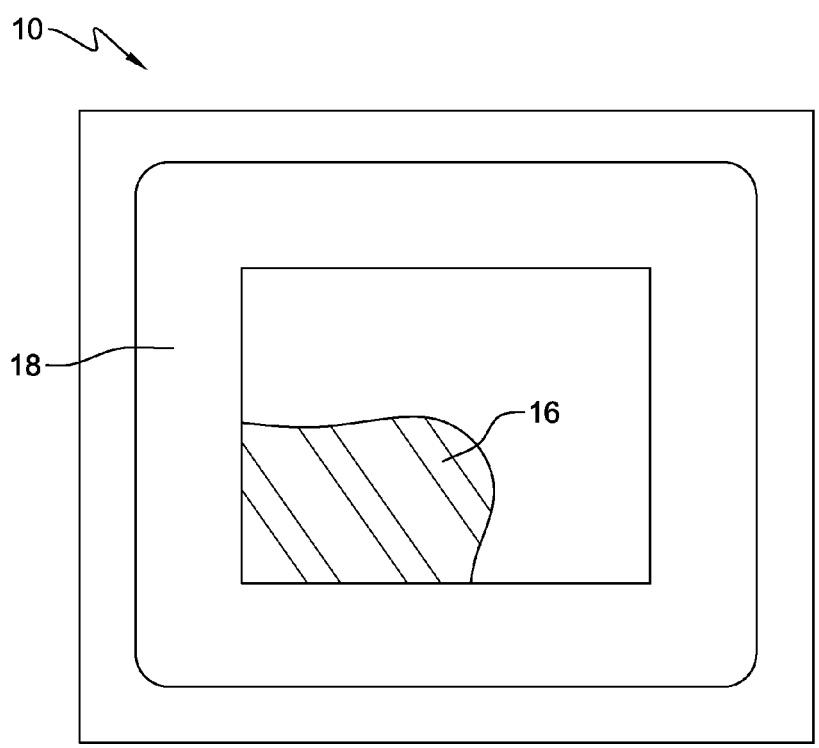
FIG. 1B is a cut-away planar view of the module assembly of FIG. 1A, shown assembled, in accordance with one or more aspects of the present invention.

Referring to FIGS. 1A & 1B, one embodiment of a thermal conduction module 10 assembly kit is shown which has a rectangular geometry, however, other geometries such as circular are also possible. The module 10 includes a square or rectangular shaped substrate 14, which is designed to accept an integrated circuit 16 such that the bottom of the integrated circuit is fitted to the substrate 14. A square or rectangular shaped cover 18 is designed to fit over, contact, and couple with the substrate 14 via a positioning ring 20. The positioning ring 20 circumscribes the perimeter the cover 18. The module 10 is shown assembled in FIG. 1B.

A shim member 22 is positioned between integrated circuit 16 and cover 18. Shim member 22 (in one embodiment) is rectangular in shape, but can also be other geometries such as circular, or other shapes providing the function disclosed herein. Shim member 22 has a predetermined thickness that provides a desired space between integrated circuit 16 and the bottom of the cover 18, when the thermal conduction module 10 is assembled.

Further, shim member 22 is removable. Once the module 10 is assembled with shim member 22 in place, the positioning ring 20 is situated so that its bottom is resting on the substrate 14. Manipulation of the size of the gap is accurately achieved by adjusting the size (vertical dimension) of the shim. The positioning ring 20 configuration can achieve a gap vertical dimension necessary to apply a film over the integrated circuit of much more thermally conductive material.

The positioning ring 20 is then affixed to the cover 18 using an adhesive, for example, an epoxy or solder. The shim member 22 can subsequently be removed, and a gap is defined by the top of the integrated circuit 16 and the bottom of the cover 18. The gap has a vertical dimension equal to the thickness or vertical dimension of shim member 22, and is sustained by the positioning ring 20 being in contact with the substrate 14 and affixed to the cover. The gap is filled with a thermally conductive medium, or thermal compound, for example, ATC. Heat from the integrated circuit 16 is substantially dissipated via the thermally conductive material, the cover and, if used, the solder.

Referring collectively to FIGS. 2A & 2B, two embodiments of apparatuses 40, 40' for deploying a thermal conduction module 80 are shown having substantially similar construction, however, having some differences in internal structure. The apparatuses 40, 40' shown in FIGS. 2A & 2B include an enclosure structure 42 having a circular hollow center area 44, and a top 46 and bottom 48. The apparatus 40 shown in FIG. 2A includes an application pusher 50 which is generally cylindrical in shape and includes a lower portion 52, and an upper portion 54. The upper portion 54 extends through a hole 56 in the top 46 of the enclosure structure 42. An actuation handle 58 is connected at a pivot point 59 to the upper portion 54 of the application pusher 50.

The apparatuses 40, 40' shown in FIGS. 2A & 2B further include, a thermal conduction module 80, which is essentially the same as the module 10 shown in FIGS. 1A & 1B, having a cover 82, a substrate 84, a shim 86 (shown in FIG. 2A), thermal compound 87 (shown in FIG. 2B) and an integrated circuit 81. The integrated circuit is mounted on top of the substrate 84, and the shim 86 is positioned between the integrated circuit and the cover 82. The cover 82 is designed to be positioned over the integrated circuit, leaving a portion of the substrate exposed. A specific measurable distance is created between the cover 82 and the integrated circuit corresponding to the vertical dimension of the shim 86. The module 80 is positioned in a recessed area in the bottom 48 of the enclosure structure 42, such that the substrate 84 generally fits into the recessed area.

Referring to the apparatus embodiment shown in FIG. 2A, two adjustment ring pushers 60 partially circumscribe the application pusher 50. The top of the adjustment ring pushers 60 include flanges 61 which make contact with the top of the application pusher 50, and the bottom of the adjustment ring pusher 60 contacts the top of an adjustment ring 62. The adjustment ring 62 circumscribes the perimeter of cover 82. The bottom of the adjustment ring 62 contacts the top of the exposed substrate 84. The adjustment ring pusher 60 is spring loaded to forgivingly contact the adjustment ring 62. The springs 64 are connected to the top of each adjustment ring pusher 60 so that they can act independently of each other. The spring loaded adjustment ring 62 provides substantial prevention of damaging contact with the substrate 84.

The lower portion 52 of the application pusher 50 is removably connected to the top of the cover 82 of the module 80. Thereby, the application pusher 50 can vertically adjust the cover 82. When manipulating the cover, the application pusher 50 can align the perimeter of the cover 82 with the adjustment ring 62. If the application pusher 50 attempts to lift the cover above the adjustment ring 62, the flanges 61 at the top of the adjustment ring pushers 60 contact the top of the application pusher lifting the cover and adjustment ring off the shim and substrate respectively, thereby maintaining contact between the cover 82 and the adjustment ring 62.

Once cover 82 is positioned on top of shim 86 and the bottom of the adjustment ring 62 is positioned on the top of the substrate, portions of the inner edge of the adjustment ring can be affixed to the perimeter of the cover 82 using a quick curing epoxy or solder or a similar substance performing an equivalent function. The shim can then be removed to produce a gap between the cover and the integrated circuit. The gap can be filled by injection of a thermal compound such as, for example, ATC.

Referring to the apparatus 40' shown in FIG. 2B, a controlling member 51 has lower portions 53 removably affixed to the adjustment ring 62. The controlling member 51 is manipulated using the actuation handle 58 to raise and lower the controlling member 51 in unison with the adjustment ring 62, thereby aligning the adjustment ring with the cover 82. As shown in FIG. 2B, the adjustment ring is affixed to the cover and the shim 86 has been removed. The resulting gap is filled with thermally conductive compound 87.

Figure 3A:
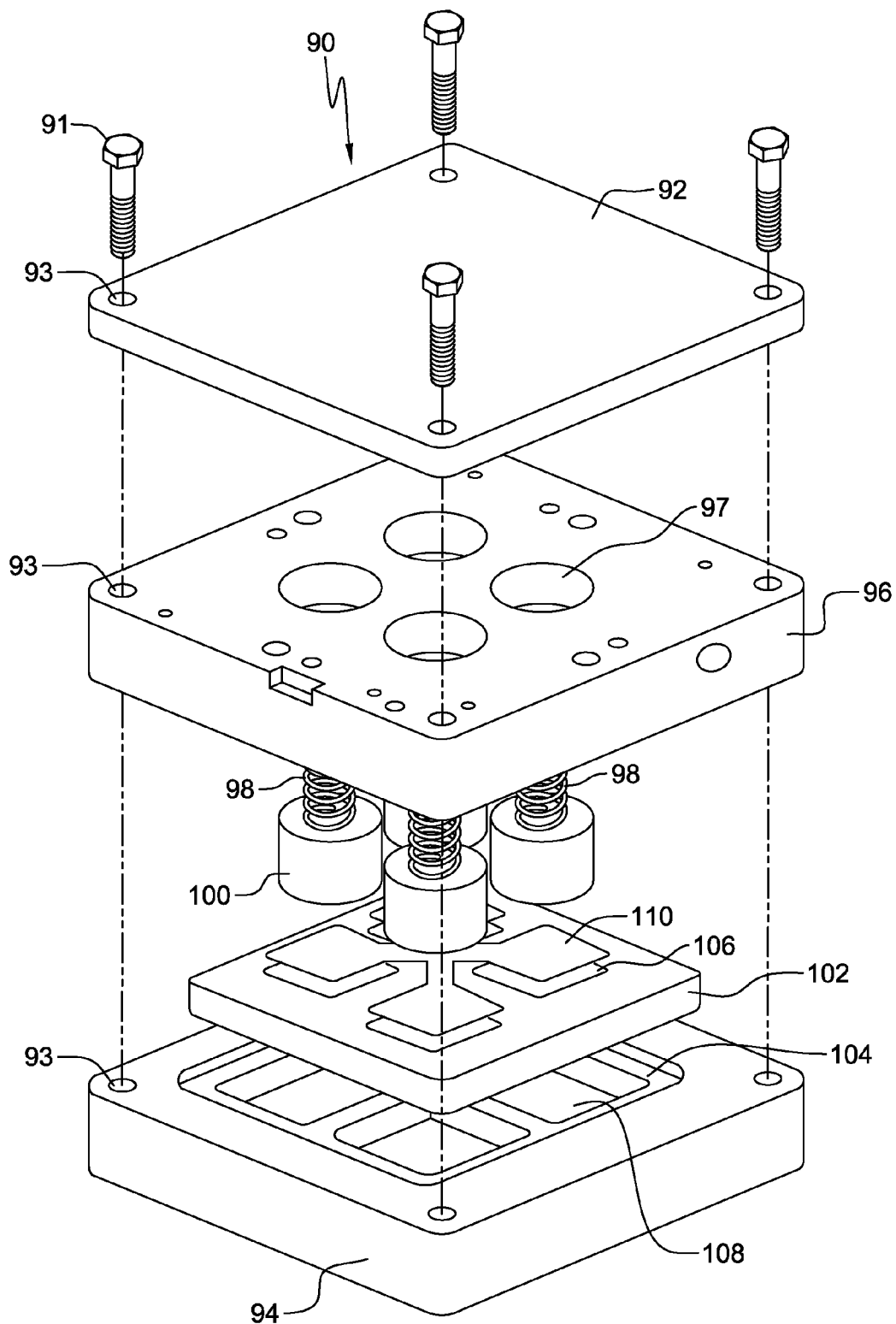
FIG. 3A is an exploded view of another embodiment of a thermal conduction module assembly kit, in accordance with one or more aspects of the present invention.
Figure 3B:
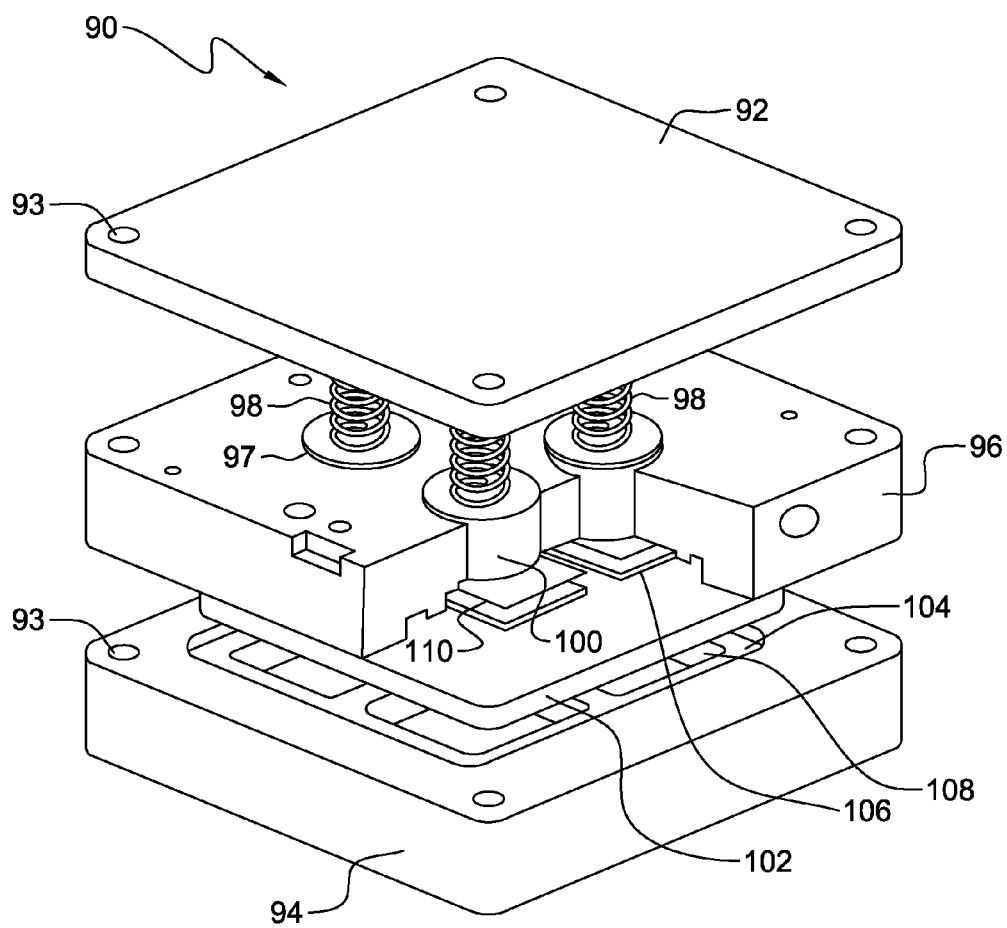
FIG. 3B is a partially assembled view of the partially assembly module shown in FIG. 3A, in accordance with one or more aspects of the present invention.

Referring to FIGS. 3A & 3B, another embodiment of a thermal conduction module 90 assembly kit is shown. Module 90 includes a covering plate 92 substantially rectangular, and having four openings or apertures 93, one towards each corner and extending vertically through the covering plate 92. The module 90 further includes a base 94, being substantially rectangular in shape and having four apertures 93, one towards each corner, aligning with the apertures 93 in the covering plate 92. The base 94 is further designed to have four recessed areas 108 which are designed to hold integrated circuits 106. Although the particular embodiment shown herein is rectangular, other geometries can be used, such as, circular.

The module 90 further includes a positioning member or holding structure 96. The holding structure 96 is rectangular-shaped, and includes four apertures 93 towards each corner, and is designed to mate with the covering plate 92, such that the apertures 93 on the cover and holding structure line up for fasteners 91 to access both. Four openings 97 house four thermally conductive elements 100 and their attached springs 98. The near end of the springs 98 can pass through the opening 97 and contact the cover 92. The distal end of the springs 98 contact the thermally conductive element 100 to provide a spring tension to the thermally conductive element 100 in the downward direction toward the shim 110. The thermally conductive elements 100 or cylindrically shaped covers are movably received in their corresponding openings in the positioning member or holding structure 96. Thus, the spring 98 and thermally conductive element 100 arrangement provides a spring loaded thermally conductive element which can apply forgiving pressure to the shim 110.

The module 90 further includes a substrate plate 102. The substrate plate 102 is rectangular in shape and designed to fit in a recessed area 104 in the base 94. The substrate plate 102 is designed to hold, by way of example, four integrated circuits placed equidistant from each other on the substrate plate 102.

The removable shim 110 is designed to fit over each integrated circuit 106 and under each thermally conductive element 100. Thus, the removable shim 110 fits between the thermally conductive element 100 and the integrated circuits 106. The removable shim 110 has four rectangular pieces joined by interconnecting pieces in the center. The removable shim 110 has a predetermined and specific thickness or vertical dimension. The vertical dimension corresponds to a desired gap dimension, between the top of the integrated circuit and the bottom of the thermally conductive elements 100 that will be filled with thermally conductive material.

The module 90 allows for the thickness determined by the shim 110 to be different from each integrated circuit 106. The apertures on the covering plate 92 aligning with the apertures on the base 94 are designed to receive fasteners 91 which can be gradually and incrementally tightened and loosened at each individual location to tilt the thermally conductive element 100 to produce a desired vertical dimension defined by the shim. The adjustment fasteners 91, positioned through the apertures 93, allow manipulation of the cylindrical thermally conductive elements 100 to adjust to the height and shape of the shim 110. Thus, the gap height can be adjusted by positioning the thermally conductive elements 100 using the removable shim 110. The gap size is thereby adjustable to a size to accept a film of thermally conductive material or substantial layer of thermally conductive material.

When the cylindrical thermally conductive elements 100 are ready to be positioned over the integrated circuits 106, the cylindrical thermally conductive elements 100 are affixed to the holding structure 96 and/or to the inner surface and edge of the openings 97 in the holding structure 96. The thermally conductive elements 100 are affixed using, for instance, solder which is applied into a gap between the thermally conductive elements 100 and the inner surface of the opening 97 in the holding structure 96. The module 90 is fixed together using fasteners 91 through the aligned apertures 93 in the plate 92 and the base 94. Tightening the fasteners 91 spring loads the thermally conductive elements 100 fixed in the openings 97 of the holding structure 96 over the shim 110 and the integrated circuits.

After the thermally conductive elements 100 are soldered into place, and the embodiment shown in FIGS. 3A & 3B is assembled using the fasteners 91, the gap between the integrated circuit and the thermally conductive element needs to be set. To set the gap, the module 90 may be heated and then cooled to utilize the spring loaded tension of the thermally conductive elements 100. When assembled, the module 90 is heated to an elevated temperature to liquefy the solder. At this time, the thermally conductive elements 100 are released from being secured to the thermally conductive element inner surface. The springs 98 then force the thermally conductive elements 100 to move towards the integrated circuit contacting the shim 110.

More specifically, the module 90 is heated, which melts the solder holding the spring loaded thermally conductive elements 100. The thermally conductive elements thereby contact the removable shim with a force provided by the spring in the downward direction, toward the shim 110. When the module 90 is cooled, the thermally conductive elements 100 are secured in their new position to the openings 97 inner surface and edge by the solidifying solder. Thus, cooling the assembled module 90 allows the thermally conductive elements 100 to freeze into the new position, because of the solidified solder, of contacting the shim 110. The thermally conductive elements 100 are now secured in their new position contacting the shim 110.

Figure 4:
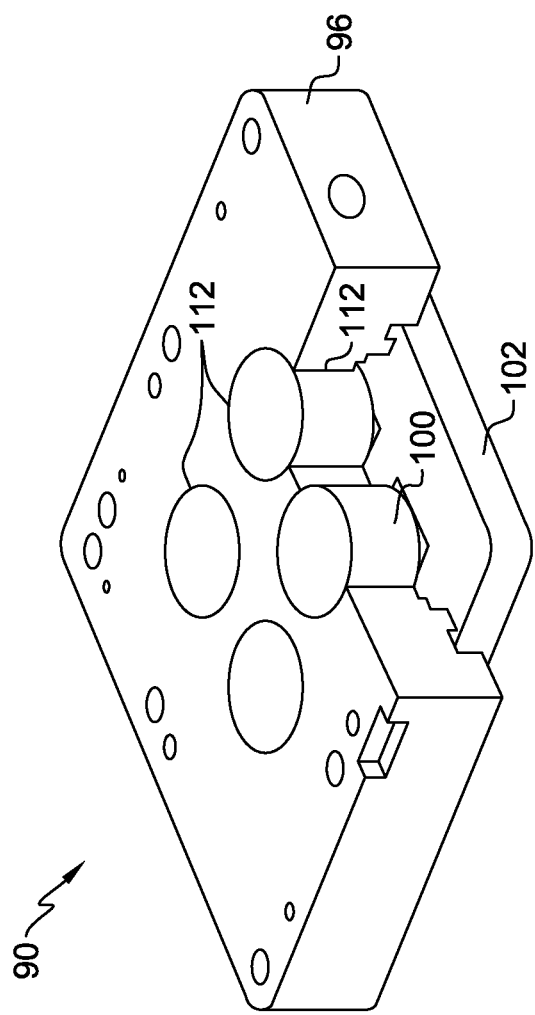
FIG. 4 is a cut-away planar view of the partially assembled module shown in FIG. 3A, in accordance with one or more aspects of the present invention.
Figure 5:
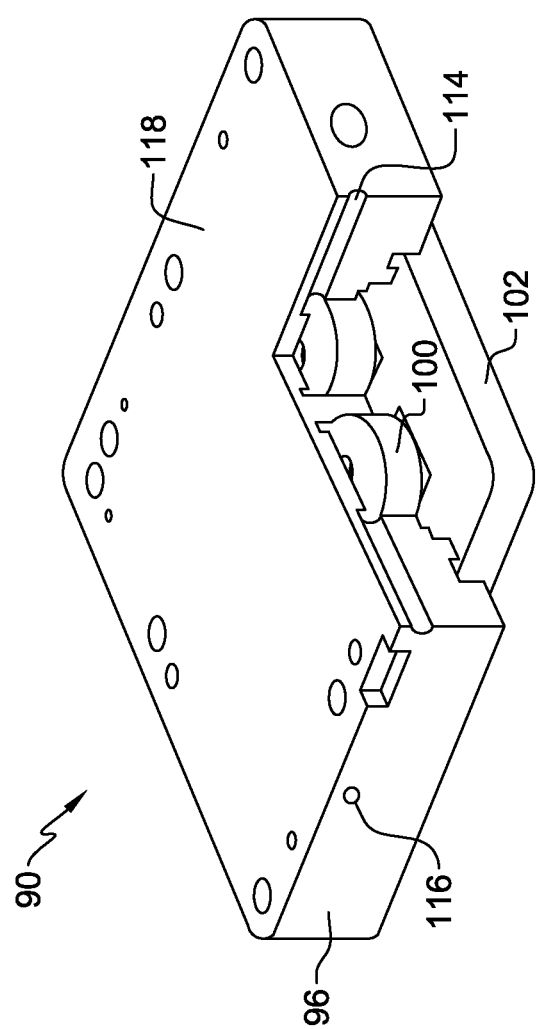
FIG. 5 is a cut-away planar view of the assembled module shown in FIG. 3B, in accordance with one or more aspects of the present invention.

The module can then be disassembled. The covering plate 92, fasteners 91, substrate plate 102, shim 110 and springs 98 are removed to be reused, leaving holding structure 96 with thermally conductive elements 100 in place in relation to integrated circuit 106 located on the substrate 102. The module is reassembled, as shown in FIGS. 4 and 5, with the thermally conductive elements 100 affixed to the holding structure 96. The holding structure and thermally conductive elements are encased between the substrate 102 and the top plate 118.

A gap is defined by the bottom of the cylindrical thermally conductive element 100 and the top of the integrated circuit 106. The gap is substantially the same vertical dimension or thickness of the removable shim 110. The gap is sustained by the soldered thermally conductive elements 100 maintaining their position in the holding structure 96. The module 90 allows the thickness of the shim to set a gap between the thermally conductive elements 100 in relation to each integrated circuit 106.

In another embodiment, the thermally conductive element 100 could have a negative gap in relation to shim 110 and integrated circuit 106. In this case, the base 94 will hold springs (not shown in drawings) having a greater force than the springs 98 contacting the thermally conductive elements 100. Thus, springs are introduced between the base 94 and the substrate 102 such that the substrate 102 is spring loaded toward the thermally conductive elements 100. The base 94 contacts the bottom of the substrate 102, applying upward force to the thermally conductive elements 100. The integrated circuits and the shim 110 are thereby urged toward the bottom of the thermally conductive elements 100.

Referring to FIGS. 4 and 5, the module 90 is shown in its fixed position and having solder interfaces 112. Further, the module 90 includes vent holes 116 and vent channels 114 in the holding structure 96. Further, a top plate 118, as shown in FIG. 5, may be fabricated of copper and function as an additional heat dissipater. Heat from the integrated circuits 106 is substantially dissipated via conduction from the integrated circuits to the solder interfaces 112, through the thermally conductive elements 100, and also through the top plate 118.

The operation of the module disclosed herein is described below, first with reference to FIGS. 1A & 1B. The thermal conduction module 10 assembly kit includes substrate 14, which is designed to accept an integrated circuit 16. The cover and positioning ring 20 are designed to work in concert such that the positioning ring circumscribes the perimeter of the cover and is slidable in relation to the cover. The positioning ring 20 is placed on the base while the cover is vertically adjusted to be positioned on top of the shim member 22. Before the cover and positioning ring 20 are affixed together, they are adjusted to position the cover over the integrated circuit per a determined specification using the shim member 22. The cover and positioning ring 20 are then affixed together. The cover and attached positioning ring 20 are removed along with the shim member 22. Then, cover 18 and affixed positioning ring are replaced such that the cover fits over the integrated circuit, contacts, and mates with substrate 14, defining a gap between the top of the integrated circuit and the bottom surface of the cover. The gap has the vertical dimension of the shim member. The gap's vertical dimension can be adjusted as described above to accommodate variable amounts of thermal compound, varying from a film, to a substantial layer of thermally conductive compound. Once the gap size is determined, adjusted for and set, the desired amount of thermal compound as defined by the gap size is injected into the gap to enhance thermal conductivity. The finished assembly substantially dissipates heat via the thermal conductive compound, to the cover 18, and through any solder interfaces. Thus, heat is effectively dissipated away from the integrated circuits.

In the operation as described herein, and referring to FIGS. 2A & 2B, the apparatuses 40, 40' for deploying a thermal conduction module have a thermal conduction module 80 mounted in the recessed portion of the bottom 48 of the enclosure structure 42. Referring to FIG. 2A, the application pusher 50 is removably affixed to the top of the cover. The cover is positioned over the integrated circuit and the shim is used to define the desired vertical distance between the integrated circuit and the bottom of the cover. The actuation handle 58 is manipulated forward and back pivoting about pivot point 59 to adjust the application pusher vertically up and down with the cover attached to the bottom 52 of the application pusher 50. The removable shim 86 has a specified vertical dimension so that according to the invention after the shim 86 is removed a desired gap will remain having the same specified dimension. The cover 82 attached to the bottom 52 of the application pusher 50 is adjusted using the handle 58 to attain a plurality of shim vertical dimensions. After the cover is adjusted via the handle 58 to accommodate the shim 86 the adjustment ring 62 is affixed to the outer edge of the cover 82.

Referring to FIG. 2B, the controlling member 51 is removably affixed to the positioning ring 62 and moves the positioning ring into place adjacent to the cover 82 where the positioning ring and cover are affixed. The cover with the adjustment ring attached can be lifted to remove the shim 86, and reassembled leaving a gap having the vertical dimension of the shim. The remaining gap is defined by the bottom of the cover and the top of the integrated circuit. The gap is maintained by the inner edge of the adjustment ring being attached to the perimeter of the cover, and the bottom of the adjustment ring contacting the substrate 84. The gap can be specified by the shim dimensions to accommodate from a film of conductive material, to a substantial layer of conductive material. A thermal compound 87 can then be injected into the gap to provide a module with enhanced thermal conductivity. The heat generated by the integrated circuit generally dissipates via the thermal conductive material, through solder interfaces, if any, and to the cover 82. Thus providing effective dissipation of heat away from the integrated circuits.

The operation of another embodiment of a thermal conduction module assembly kit is also described herein, and shown in FIGS. 3A-5. The integrated circuits 106 are mounted in the substrate 102 and a removable shim element is placed between the cylindrical thermally conductive elements 100 and the integrated circuits 106. The removable shim has a specified thickness or vertical dimension. The cylindrical thermally conductive elements 100 are spring loaded in the downward direction towards the shim 110 by securing the thermally conductive elements with solder to the inner surface and edges of the openings 97. The module 90 is incrementally compressed by turning adjustment fasteners 91 through the mating apertures 93 in the cover, the holding structure 96, and the base 94.

Once the module is assembled using fasteners 91, and any desired tilt caused by varying thicknesses of the shim element 110 is adjusted for by the adjustment fasteners 91, the module 90 is ready to be heated and cooled to set the gap between the integrated circuit and the bottom of the thermally conductive elements. The module is heated to a temperature which melts or liquefies the solder securing the thermally conductive elements in place, thereby releasing the thermally conductive elements by virtue of the spring tension and enabling the thermally conductive elements 100 to contact the shim 110. After the module 90 is cooled, the thermally conductive elements are re-secured to the inner surface and edges of the openings 97 by the solidifying solder. Once the cooling and solder solidification has taken place, the module is disassembled and the covering plate 92, the springs 98, the shim 110, and the base 94 can be removed. The holding structure 96 with affixed thermally conductive elements 100 can be reassembled to the substrate 102 with integrated circuits, including a top plate 118, for instance, made of copper to provide heat dissipation. A gap, having the same vertical dimension as the shim element, is now defined by the bottom surface of the thermally conductive element 100 and the top of the integrated circuit 106. A thermally conductive material can now be injected into the gap to enhance thermal conductivity.

The top surface of the holding structure 96 and the top of the thermally conductive elements 100 may be re-machined to provide a smooth top surface of holding structure 96. The top plate 118 is affixed to the top of the holding structure 96.

Using the apparatus and method above, the small gap can be defined to accommodate from a film, to a more substantial layer of thermally conductive material. The heat generated by the integrated circuits is substantially dissipated via the thermally conductive material, through the thermally conductive elements 100 and the solder interfaces 112, and conducted to the top plate 118. Thereby, providing effective dissipation of heat away from the integrated circuits.

The above-described apparatuses and methods present a small gap technology (SGT) approach, wherein the gap to accommodate the thermal interface material between the integrated circuit or electronic component to be cooled and the thermally conductive element, is accurately controlled. To achieve ever-increasing performance, such as to achieve greater floating point calculations per second in a high-performance computing (HPC) machine, the number of microprocessors, the number of cores per microprocessor, and number of transistors per unit area in each core, continues to increase. This results in an ever-increasing total heat load at the microprocessor level and increasing heat flux (i.e., heat dissipation per unit area). For small increases in heat flux, traditional microprocessor packaging, such as modules, have been coupled to air-cooled heat sinks, which can be enhanced with heat pipes, vapor chambers, increased fin heights, exotic spreader materials, and increased airflow. These solutions, however, are unable to achieve the high-heat flux dissipation needed for future high-performance computing (HPC) modules. Such modules may require more active, liquid-coolant cooling.

Note that in the following discussion, one example of coolant used within the coolant-cooled electronic modules presented is water. However, the concepts disclosed are readily adapted for use with other types of coolant. For example, the coolant may comprise a brine, a glycol mixture, a fluorocarbon liquid, or other coolant, or refrigerant, while still maintaining the advantages and unique features of the present invention.

Figure 6:
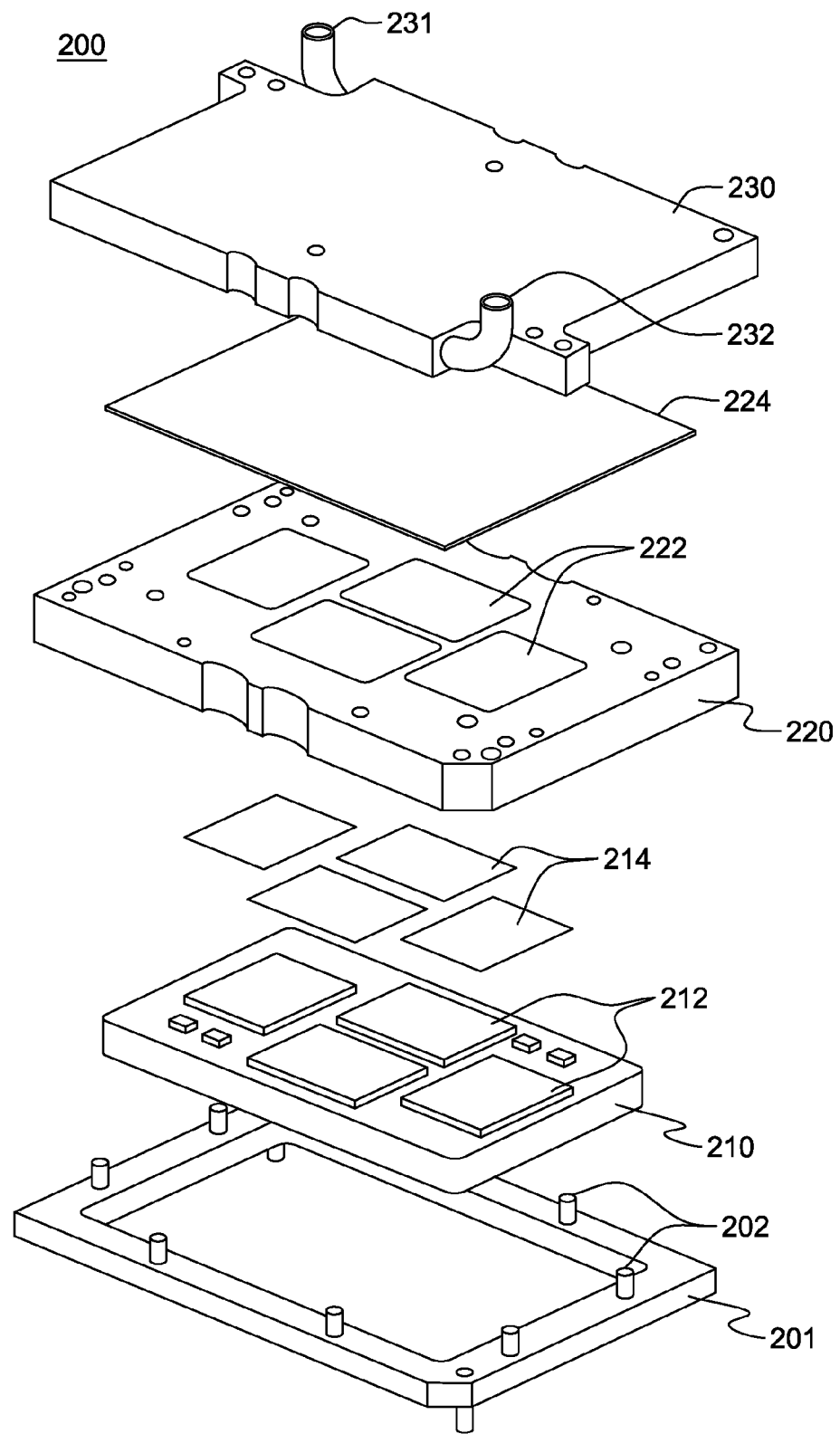
FIG. 6 is a partially exploded view of one embodiment of a coolant-cooled electronic module employing small-gap technology (SGT), thermally conductive elements, in accordance with one or more aspects of the present invention.

One approach to handling increased heat flux is to employ a separable, coolant-cooled cold plate structure. One embodiment of this approach is depicted in FIG. 6, which illustrates a coolant-cooled electronic module, generally denoted 200, that includes a lower module support frame 201 configured to receive a multi-component assembly 210 therein. Multi-component assembly 210 includes multiple integrated circuit chips or electronic components 212 to be cooled disposed on (e.g., recessed within) an upper surface thereof. This module approach of FIG. 6 utilizes small gap technology cooling, wherein a thermal interface material 214 interfaces each integrated circuit chip to a respective thermally conductive element 222 of a module lid assembly 220. As shown, module lid assembly 220 aligns over lower module support frame 201 using alignment pins 202. The thermally conductive elements 222 may have the gap between the conduction surface thereof and the respective electronic component 212 set using small gap technology processing, such as described above in connection with one or more of FIGS. 1A-5. As noted, the thermal interface material 214 may vary, depending upon the desired thermal interface material (TIM) application from, for instance, a film to a more substantial layer of thermally conductive material. As explained, the gap between the thermally conductive element 222 and the respective electronic component 212 conforms to each electronic component site based, for instance, on the desired filler material height. Increased heat dissipation is achieved in this implementation by coupling a liquid-cooled cold plate 230 via a second thermal interface material 224 to module lid assembly 220, and in particular, to the thermally conductive elements 222 of module lid assembly 220. Liquid-cooled cold plate 230, which comprises a thermally conductive structure that is self-contained and separable from the lid assembly, includes passages or channels (not shown) therein, through which liquid coolant flows between, for instance, a coolant inlet 231 and a coolant outlet 232 of liquid-cooled cold plate 230. This liquid-cooled cold plate is conduction-coupled via the second thermal interface material 224 to the thermally conductive elements 222 within module lid assembly 220 to provide greater module cooling performance compared with, for instance, an air-cooled-only approach.

Although the liquid-cooling approach of FIG. 6 provides greater cooling performance than a multichip module fabricated using air-cooling and small gap technology processing only, still greater cooling performance may be required for future high-performing processors. Described hereinbelow with reference to the embodiment of FIGS. 7A-9C is another coolant-cooled electronic module, capable of meeting the high-heat flux requirements of (for instance) an HPC microprocessor assembly, while maintaining the advantages of re-workability, small thermal interface bond line between the processor and module lid, and segregation of coolant from the active structures and interconnects in the packaging.

Generally stated, a coolant-cooled electronic module is provided herein below which includes a multi-component assembly; a module lid assembly; an inner manifold element; and an outer manifold element. The multi-component assembly includes multiple electronic components to be cooled, such as multiple integrated circuit chips, disposed on a substrate, and the module lid assembly includes a module lid and multiple thermally conductive elements. The module lid includes multiple openings (or apertures) through the module lid aligned over the multiple electronic components of the multi-component assembly, and the multiple thermally conductive elements are disposed in respective openings in the module lid. In one implementation, at least one one thermally conductive element of the multiple thermally conductive elements includes opposite coolant-cooled and conduction surfaces, with the conduction surface being thermally coupled to one electronic component of the multiple electronic components of the multi-component assembly via, for instance, a thermal interface material such as described above in connection with FIGS. 1A-5.

The inner manifold element is disposed over the lid assembly and includes first and second opposing main surfaces, with the first main surface being configured to facilitate the flow of coolant onto, at least in part, the coolant-cooled surface of the one thermally conductive element. The inner manifold element includes a coolant supply opening disposed over the coolant-cooled surface of the one thermally conductive element, and a coolant exhaust channel disposed, at least in part, adjacent to the coolant-cooled surface of the one thermally conductive element. The outer manifold element is disposed over the inner manifold element and is coupled (e.g., sealed) to the module lid, with the inner manifold element disposed between the outer manifold element and the module lid. The inner manifold element and the outer manifold element together define, at least in part, a coolant supply manifold over the second main surface of the inner manifold element, and the outer manifold element and the module lid together define, at least in part, a coolant return manifold around the periphery of the inner manifold element. The coolant supply opening is in fluid communication with the coolant supply manifold, and the coolant exhaust channel is in fluid communication with the coolant return manifold, and together the coolant supply manifold, coolant supply opening, coolant exhaust channel, and coolant return manifold, facilitate flow of coolant across the coolant-cooled surface of the one thermally conductive element.

In one embodiment, the multiple thermally conductive elements are each sealed around a periphery thereof to the module lid, and each thermally conductive element includes opposite coolant-cooled and conduction surfaces, with the conduction surface thereof being disposed in opposing, spaced relation to a surface of a respective electronic component of the multiple electronic components to be cooled, and in thermal contact therewith via a thermal interface material, such as in a manner described above in connection with the SGT processing of FIGS. 1A-5.

In another embodiment, the coolant supply opening is centrally disposed over the coolant-cooled surface, and the inner manifold element includes a first coolant exhaust channel and a second coolant exhaust channel pair disposed, in part, adjacent to the coolant-cooled surface of the one thermally conductive element, to facilitate exhausting of coolant from the coolant-cooled surface. The coolant supply opening may be configured as a coolant supply slot disposed over a central region of the coolant-cooled surface, with the first and second coolant exhaust channels disposed at opposite sides of the coolant-cooled surface of the one thermally conductive element. In this configuration, coolant is introduced orthogonal to the coolant-cooled surface, and bifurcates upon contact with the coolant-cooled surface, to flow towards the first or second coolant exhaust channels at the opposite sides of the coolant-cooled surface. In one implementation, the one thermally conductive element includes a plurality of channels formed in the coolant-cooled surface thereof which facilitate heat transfer from the thermally conductive element to the coolant flowing across the coolant-cooled surface. The plurality of channels may be formed with a concave lower surface in axial, cross-sectional view so as to curve from the central region of the one thermally conductive element, upwards towards the opposite sides of the coolant-cooled surface with the first and second coolant exhaust channels disposed adjacent thereto. In this configuration, the transverse cross-sectional coolant flow area decreases within the plurality of channels from the central region of the thermally conductive element, towards the opposite sides of the coolant-cooled surface thereof.

In one embodiment, the inner manifold element further includes a manifold wall extending from the second main surface thereof, and the coolant supply manifold is disposed, at least partially, within the manifold wall of the inner manifold element, and the coolant return manifold is defined, at least in part, around the outside of the manifold wall of the inner manifold element. The coolant supply manifold resides over the multiple openings in the module lid, and in one embodiment, the inner manifold element includes multiple coolant supply openings therethrough, and lands in the first main surface thereof which are sized and configured to reside over and partially extend into the multiple openings in the module lid to, at least in part, facilitate forming multiple parallel coolant flow paths across the multiple thermally conductive elements disposed within the multiple openings in the module lid. Multiple coolant exhaust channels may be provided, each of which extends from an adjacent coolant-cooled surface of a thermally conductive element to a periphery of the inner manifold element, so as to be in fluid communication with the coolant return manifold. In one implementation, the coolant supply manifold is defined between a first portion of an inner surface of the outer manifold element and the second main surface of the inner manifold element, and the coolant return manifold is defined by the periphery of the inner manifold element, a second portion of the inner surface of the outer manifold element, and the module lid. In implementation, the outer manifold element includes a coolant inlet port in fluid communication with the coolant supply manifold, and a coolant outlet port in fluid communication with the coolant return manifold.

By way of example, the multi-component assembly may be a multichip assembly comprising multiple integrated circuit chips or die to be cooled disposed on a common substrate. Further, in one implementation, the inner manifold element and outer manifold element may be fabricated as a single, one-piece manifold structure, rather than as two or more separate pieces.

As explained further herein, coolant flow through the multiple parallel coolant flow paths across the multiple thermally conductive elements may be balanced by appropriately sizing, for instance, the coolant exhaust channels provided within the inner manifold element to ensure, in one embodiment, a substantially equal coolant flow across the different coolant-cooled surfaces of the thermally conductive elements. Coolant flow can be further facilitated by providing one or more chamfers within the first main surface of the inner manifold element adjacent to the ends of one or more coolant exhaust channels where coolant exhausts into the coolant return manifold so as to increase the volume of the coolant return manifold in that region to facilitate steady flow of coolant into and through the coolant return manifold, and thus, through the coolant-cooled electronic module.

Figure 7A:
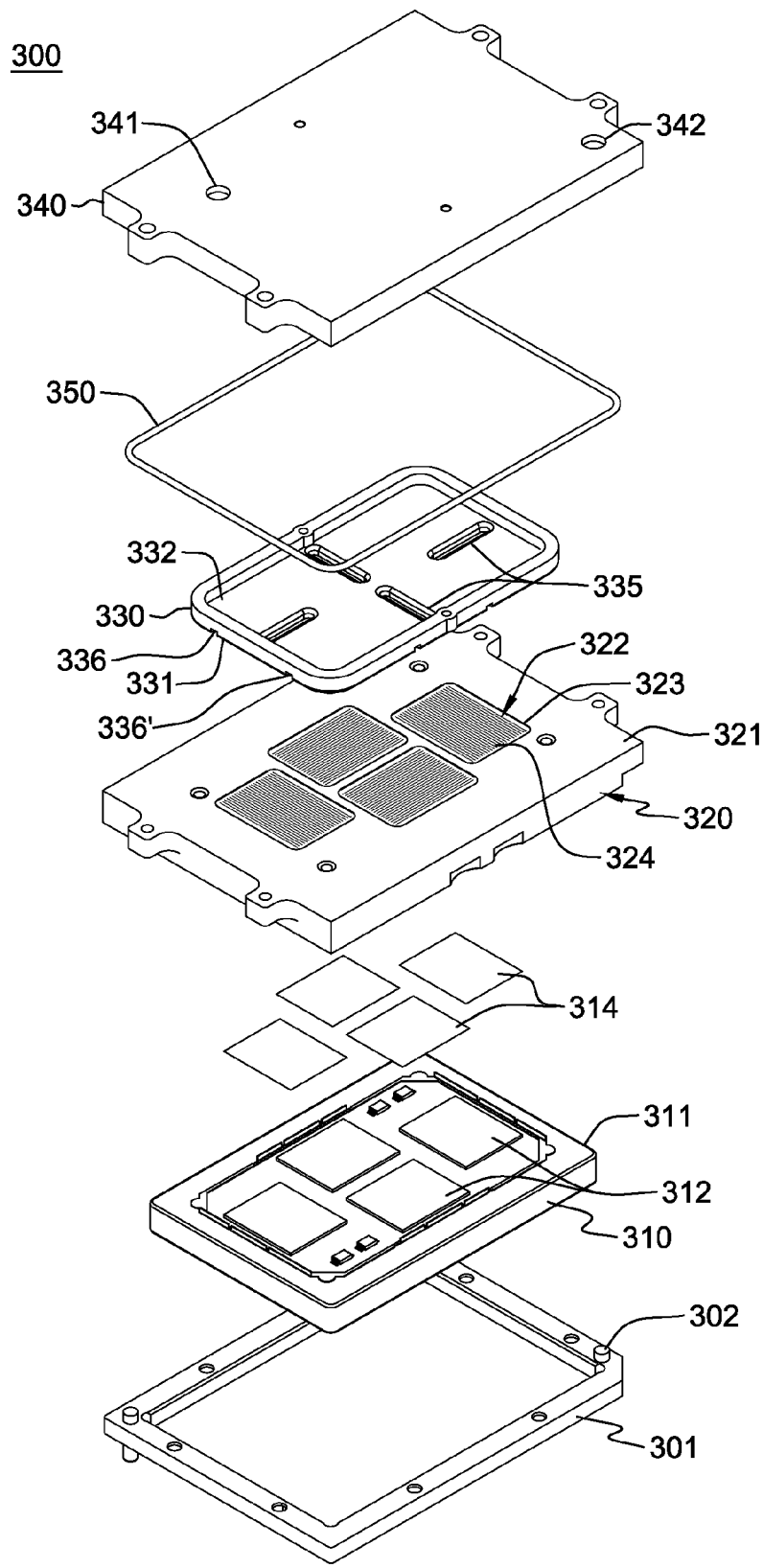
FIG. 7A is a partially exploded view of another embodiment of a coolant-cooled electronic module with integral liquid-coolant cooling of the SGT thermally conductive elements, in accordance with one or more aspects of the present invention.

FIG. 7A is a partially exploded view of another embodiment of a coolant-cooled electronic module, generally denoted 300, in accordance with one or more aspects of the present invention. As illustrated, coolant-cooled electronic module 300 includes a lower support frame 301 and a multi-component assembly 310 sized to reside on or within lower support frame 301. Multi-component assembly 310 includes a substrate 311 and multiple electronic components 312 disposed on (e.g., recessed within) substrate 311. In one embodiment, the multiple electronic components 312 comprise multiple integrated circuit chips or die, such as multiple microprocessors. These components (e.g., processor chips) dissipate heat which must be cooled to a specific temperature to ensure optimal operation and prevent malfunction.

As shown in FIG. 7A, the electronic components 312 are thermally coupled to (that is, in thermal contact with) thermally conductive elements 322 of a module lid assembly 320. Module lid assembly 320 includes a module lid 321 configured to reside over multi-component assembly 310. In one embodiment, module lid assembly 320 aligns to lower support frame 301 via multiple alignment pins 302. The thermally conductive elements 322 are disposed within respective openings (or apertures) 323 in module lid 321, which are aligned over and similarly sized and/or configured in area to the underlying electronic components 312 to be cooled. The thermally conductive elements may comprise, for instance, metal blocks or pistons, which are affixed or sealed 325 in position within their respective openings 323 using a small gap technology process such as described above in connection with FIGS. 1A-5. Note that in one implementation, it is assumed that the sealing of the thermally conductive element 322 to its respective opening 323 is a fluid-tight seal, which can be accomplished via, for instance, solder or brazing of the thermally conductive element 322 to the module lid 321 within the respective opening 323.

The thermally conductive elements 322 include opposite coolant-cooled and conduction surfaces, with the conduction surface of each thermally conductive element 322 being disposed is spaced opposing relation to a respective upper surface of an electronic component 312 to be cooled. The gap between the conduction surface of a thermally conductive element 322 and the respective electronic component 312 is set, dependent on the desired thermal interface material 314 to be employed, so that a good thermal contact pathway is established between the electronic component 312 and the thermally conductive element 322 of the module lid assembly 320. The coolant-cooled surfaces 324 of the thermally conductive elements 322 receive (for instance, via impingement) a liquid coolant which passes through respective openings 335 in an inner manifold element 330. As illustrated, the openings 335 in inner manifold element 330 extend between a first main surface 331 and a second main surface 332 thereof, which in one embodiment, are a lower surface and an upper surface, respectively, of the inner manifold element 330. An outer manifold element 340 is disposed over inner manifold element 330 and couples, for instance, seals, to module lid 321 of module lid assembly 320 via, for instance, an O-ring seal 350 and fasteners (not shown) which mechanically couple the outer manifold element 340, module lid assembly 320, and lower frame support 301 together with assembly of the module. As explained further below, outer manifold element 340 includes a coolant inlet port 341 and a coolant outlet port 342 in fluid communication with a coolant supply manifold and a coolant return manifold, respectively, formed between the outer manifold element 340, inner manifold element 330, and/or lid assembly 320.

As noted, electronic components 312 (such as processor chips) are thermally coupled to the thermally conductive elements 322 within module lid assembly 320, by a first thermal interface material (TIM1) 314. Mechanically, module lid 321 is fastened to lower support frame 301, and the assembly of the lid and frame compresses the electronic module and thermal interface material 314, providing stiffness and the necessary force to create a good thermal interface between the electronic components 312 and the respective thermally conductive element 322. The module lid assembly, and in particular, the coolant-cooled surfaces 324 of the thermally conductive elements 322 receive coolant via the coolant supply openings 335 in inner manifold element 330, and return coolant to the coolant return manifold via coolant exhaust channels (or passageways) 336, 336' formed in the first main surface 331 of inner manifold element 330. Note that the quad component or quad chip assembly depicted in FIG. 7A is presented by way of example only. Further, note that although described herein with reference to each of the thermally conductive elements as having a coolant-cooled surface, only one or more, but less than all, of the thermally conductive elements may be actively coolant-cooled as presented herein depending, for instance, on the anticipated heat dissipation or power load of the respective electronic components 312.

Figure 7B:
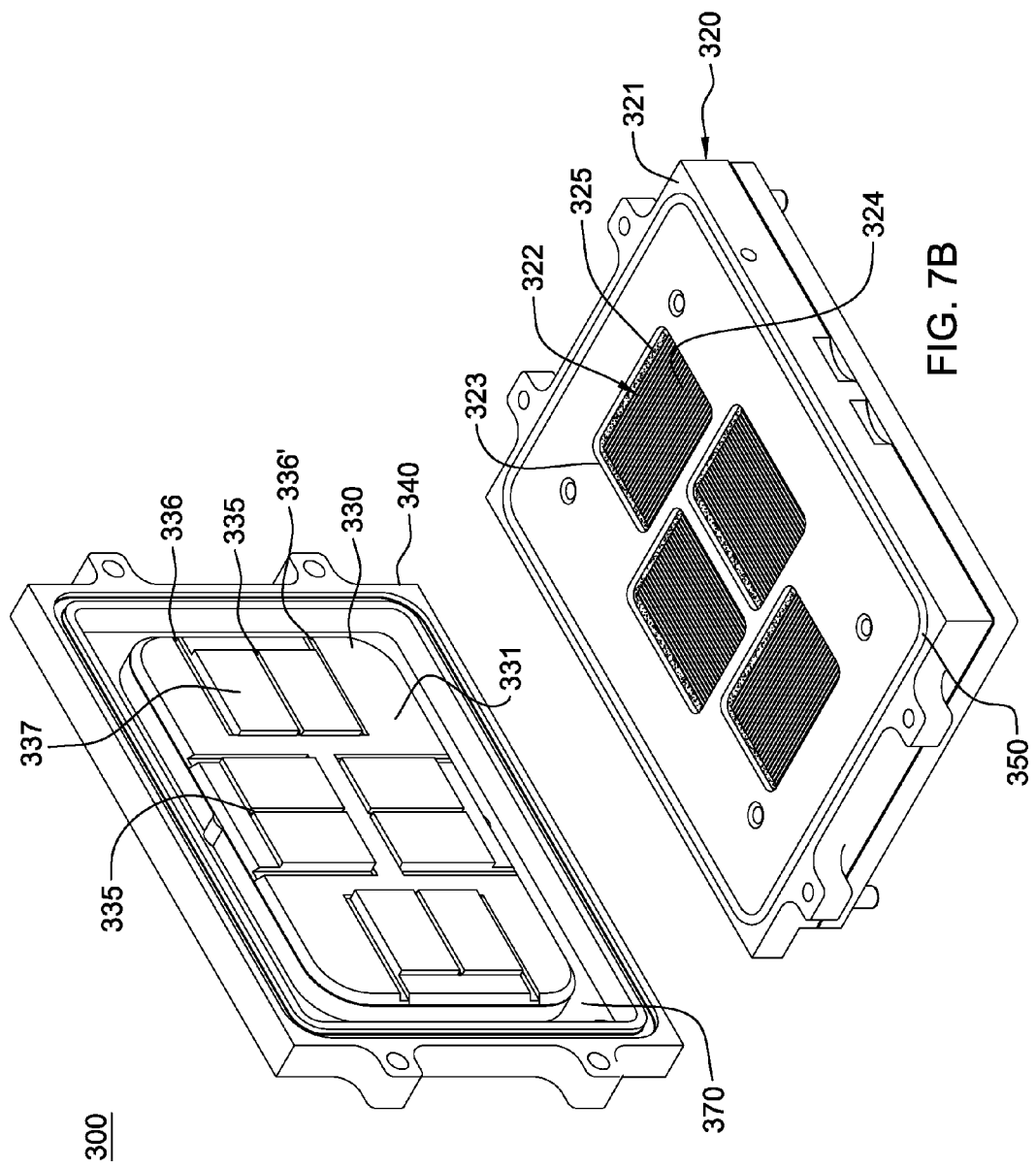
FIG. 7B is a partially assembled depiction of the coolant-cooled electronic module of FIG. 7A, with the manifold assembly removed from the module lid assembly, in accordance with one or more aspects of the present invention.
Figure 7C:
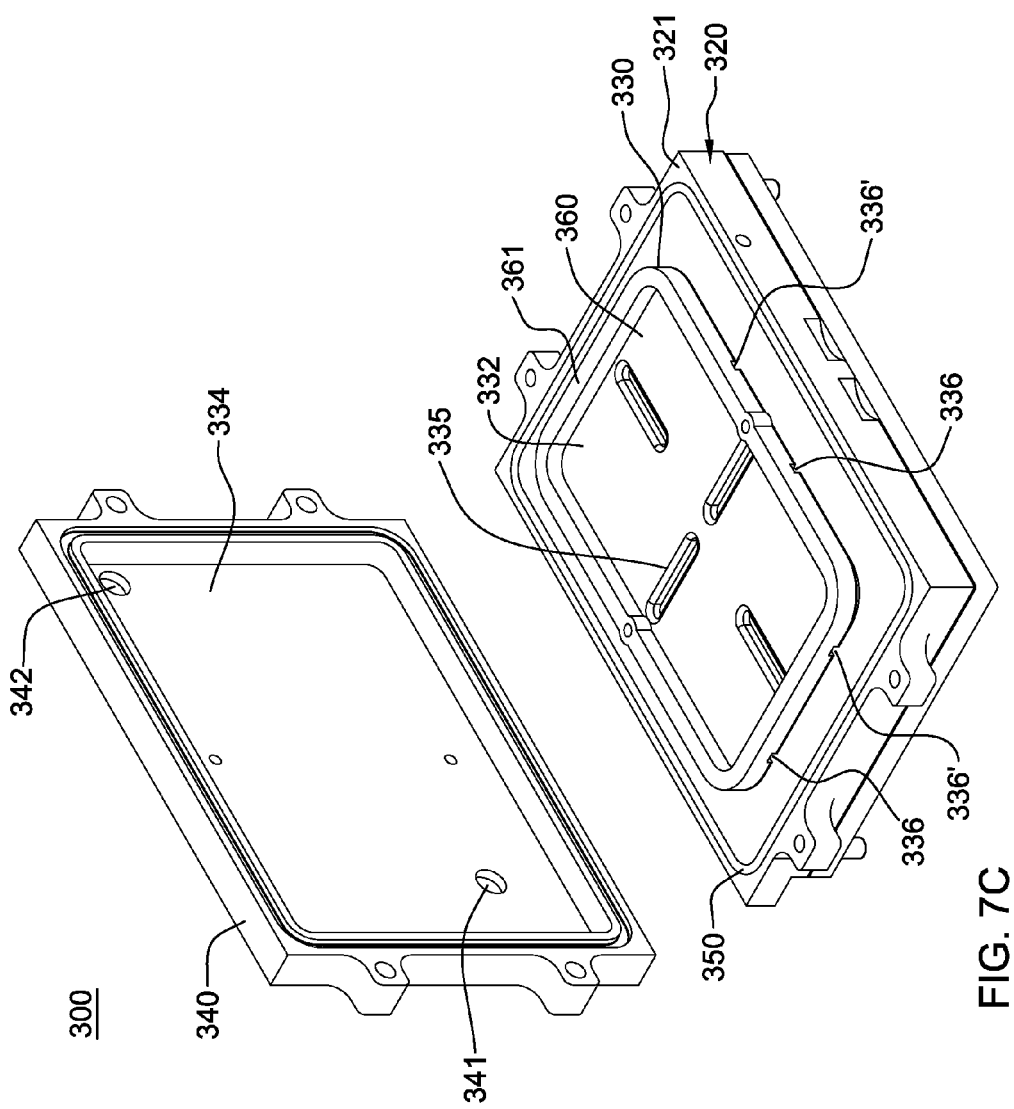
FIG. 7C is a further partially assembled depiction of the coolant-cooled electronic module of FIG. 7A, with the outer manifold element lifted away from the inner manifold element and module lid assembly, in accordance with one or more aspects of the present invention.

FIGS. 7B & 7C further depict module lid assembly 320, inner manifold element 330, and outer manifold element 340, of the coolant-cooled electronic module described above in connection with FIG. 7A. Referring collectively to FIGS. 7B & 7C, inner manifold element 330 is shown to reside over module lid assembly 320, with each coolant supply opening 335 thereof disposed to align over, for instance, a central region of a respective coolant-cooled surface of the thermally conductive elements 322 disposed over the electronic components (see FIG. 7A) of the multi-component assembly to be cooled.

As illustrated, the coolant supply openings 335 extend through the inner manifold element between the first and second main surfaces thereof. A manifold wall 361 extends, in this embodiment, around the periphery of the inner manifold element, upwards from the second main surface thereof, to facilitate forming the coolant supply manifold 360 between inner manifold element 330 and a central region of an inner surface 334 of outer manifold element 340. In this embodiment, the first main surface 331 of inner manifold element 330 includes lands 337, which are sized and configured to extend partially into openings 323 of module lid 321, within which the thermally conductive elements 322 reside and are recessed. These lands 337 facilitate defining respective closed coolant flow paths across the coolant-cooled surfaces 324 of the thermally conductive elements 322.

Also shown in FIGS. 7B & 7C are pairs of first and second coolant exhaust channels 336, 336' extending from adjacent, opposite sides of the coolant-cooled surface 324 of each thermally conductive element 322, outwards to the periphery of inner manifold element 330. At this location, the plurality of coolant exhaust channels 336, 336' are in fluid communication with the coolant return manifold 370 (FIG. 7B), defined around the periphery of inner manifold element 330 between outer manifold element 340 and module lid 321, to which the outer manifold element is sealed via, for instance, O-ring seal 350. As noted, coolant inlet port 341 is in fluid communication with coolant supply manifold 360, and coolant outlet port 342 is in fluid communication with the coolant return manifold 370. Advantageously, coolant flows via the coolant inlet port 341 and coolant supply manifold 360, through the respective coolant supply openings 335, to impinge upon the coolant-cooled surfaces 324 of the thermally conductive elements 322, and thereby facilitate transfer of heat from the respective electronic component of the multi-component assembly. The heated liquid coolant is exhausted via the one or more coolant exhaust channels 336, 336' associated with, for example, opposite sides of the coolant-cooled surface 324, into the coolant return manifold 370, which is in fluid communication with coolant outlet port 342. The thermally conductive elements 322 transfer heat, via conduction through the thermal interface material (see FIG. 7A), from the electronic components 312 to the impinging and/or flowing liquid coolant over the coolant-cooled surfaces 324. The coolant exhaust channels may be configured specifically to tune the pressure drop through each parallel coolant path, such that the coolant flow through or across each thermally conductive element (e.g., piston cold plate) is substantially equal. This tuning can be achieved, at least in part, by controlling the direction of coolant egress from the coolant-cooled surfaces to the coolant return manifold, as well as the exhaust channel's transverse cross-sectional coolant flow areas.

By way of example, coolant exhaust channel cross-section tuning can be achieved by increasing the height and/or width of one or more of the coolant exhaust channels to increase flow through the one or more particular channels, or by decreasing the height and/or width of a channel to decrease coolant flow within that channel. The coolant exhaust stream direction is controlled to prevent exhaust streams from interacting before the momentum of each stream is substantially dissipated within the coolant return manifold. Momentum dissipation is aided by providing a substantial chamfer on the first main surface of the inner manifold element in the region where the coolant exhaust channel(s) exhausts coolant into the coolant return manifold. These chamfers increase the volume of the coolant exhaust channels and return manifold in the exhaust regions, and provide a smooth exit from the coolant exhaust channels, reducing the tendency of the jetting, exhausting coolant to induce vortices and recirculation within the return manifold. These manifold enhancements may be significant in ensuring a uniform flow of coolant to the thermally conductive elements and a uniform flow of coolant from the thermally conductive elements, through the return manifold. Uniform flow of coolant is desirable in order to provide uniform cooling of the electronic components, for instance, in an application where the electronic components are dissipating similar (or the same) heat load.

Figure 8:
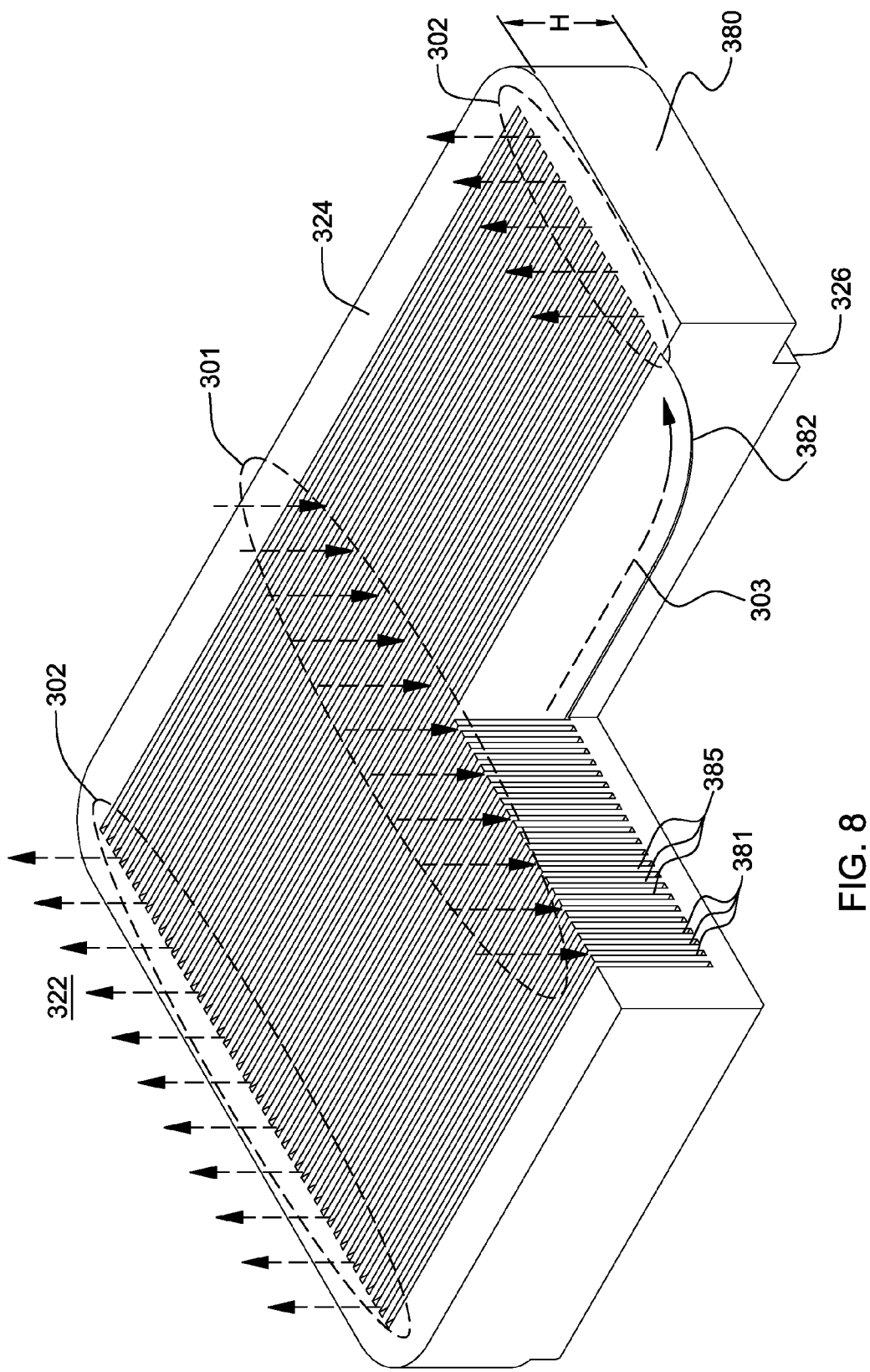
FIG. 8 depicts one embodiment of a thermally conductive element for a coolant-cooled electronic module such as depicted in FIGS. 7A-7C, in accordance with one or more aspects of the present invention.

FIG. 8 depicts one embodiment of thermally conductive element 322, which may be employed in a coolant-cooled electronic module such as described above in connection with FIGS. 7A-7C. This thermally conductive element 322 has a height 'H', in one example, in the range of 4-8 mm, and is formed from a thermally conductive block 380 of material which, in one example, may comprise a metal such as aluminum or copper. Thermally conductive element 322 includes coolant-cooled surface 324 and conduction surface 326, which are opposite main surfaces of the conduction element. As described above, conduction surface 326 is (in use) disposed in spaced opposing relation to a respective electronic component to be cooled, and is in thermal contact therewith via, for instance, a thermal interface material. In one embodiment, the coolant-cooled surface 324 receives a coolant 301 in a central region thereof, which bifurcates into bifurcated coolant flow 303, passing across the coolant-cooled surface 324 before egressing at opposite sides 302 into respective first and second coolant exhaust channels (or passageways) (see FIGS. 7B & 7C). In this implementation, the coolant-cooled surface includes a plurality of coolant channels 381 separated by a plurality of parallel-extending fins 385. As noted, introduced coolant 301 in the central region of the thermally conductive element 322 divides into a bifurcated coolant flow 303 and passes within the channels 381 to the opposite sides 302 of the thermally conductive element 322. In the embodiment depicted, the bottom surfaces 382 of channels 381 are curved in elevational view, particularly near the opposite sides of the thermally conductive element to facilitate egressing of coolant from the channels of the thermally conductive element. As one specific example, the coolant channels 381 may each have a width of 0.2 mm, and a depth of 4.0 mm in the central region thereof, with fin thickness being, for instance, 0.25 mm. Note in one example, the lands 337 (FIG. 7B) in the first main surface of the inner manifold element are sized and configured to physically contact the coolant-cooled surface 324 of the thermally conductive elements 322 disposed within their respective openings in the manifold lid. In this manner, substantially all coolant introduced into or onto the coolant-cooled surface of the thermally conductive element passes through the coolant channels 381 formed in the coolant-cooled surface.

Figure 9A:
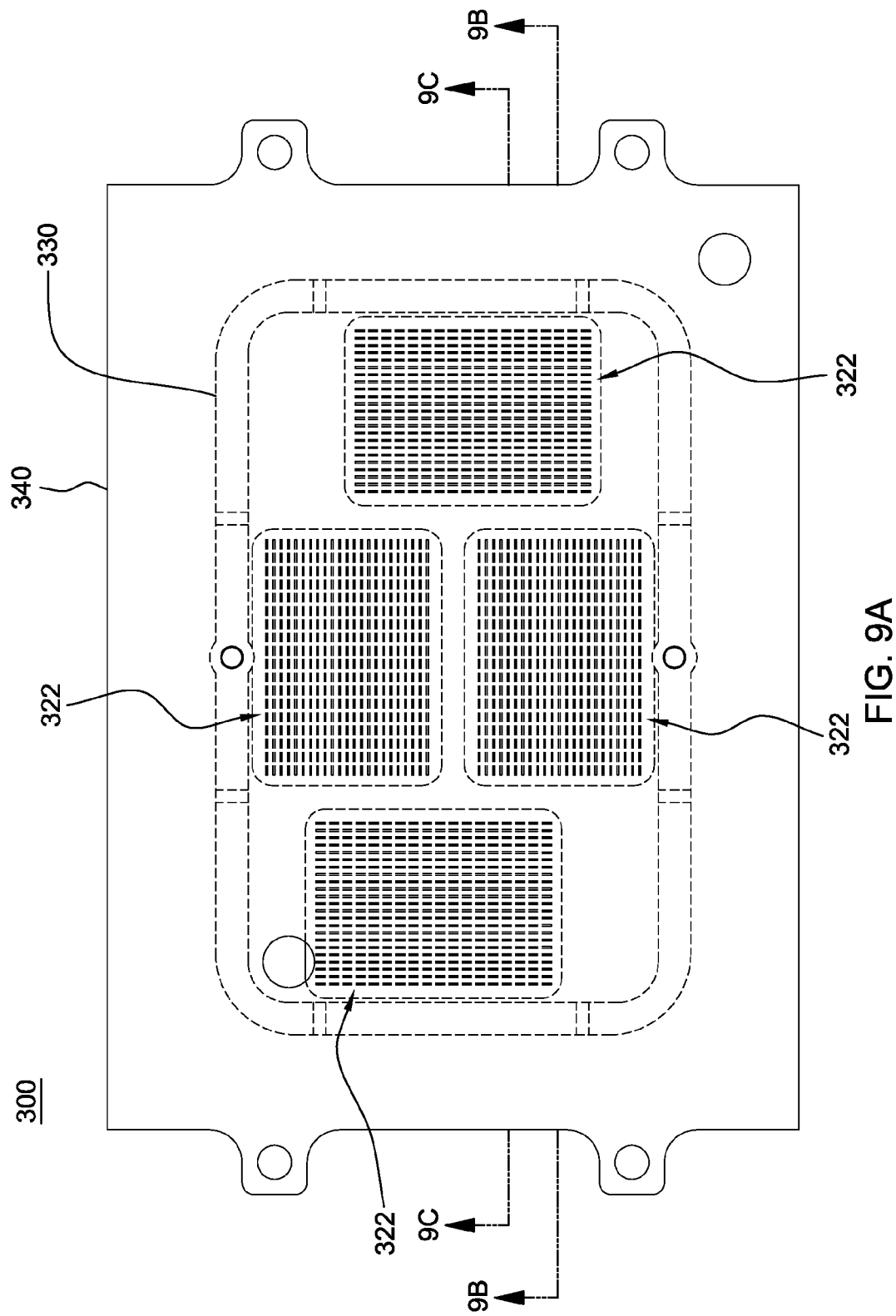
FIG. 9A is a plan view of the coolant-cooled electronic module of FIGS. 7A-8, illustrating by way of example only one layout of the thermally conductive elements thereof, in accordance with one or more aspects of the present invention.
Figure 9B:
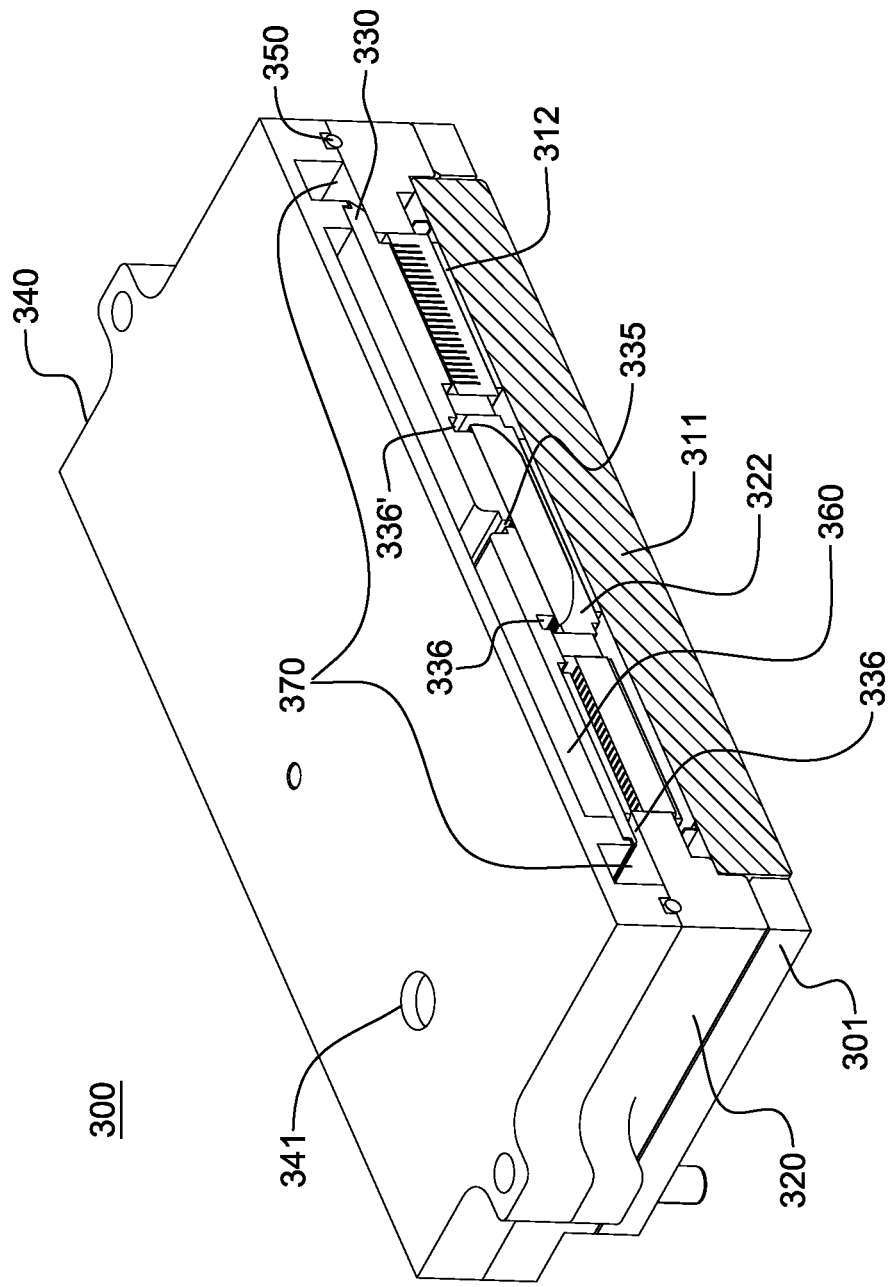
FIG. 9B is a cross-sectional depiction of the coolant-cooled electronic module of FIG. 9A, taken along line 9B-9B thereof, in accordance with one or more aspects of the present invention.
Figure 9C:
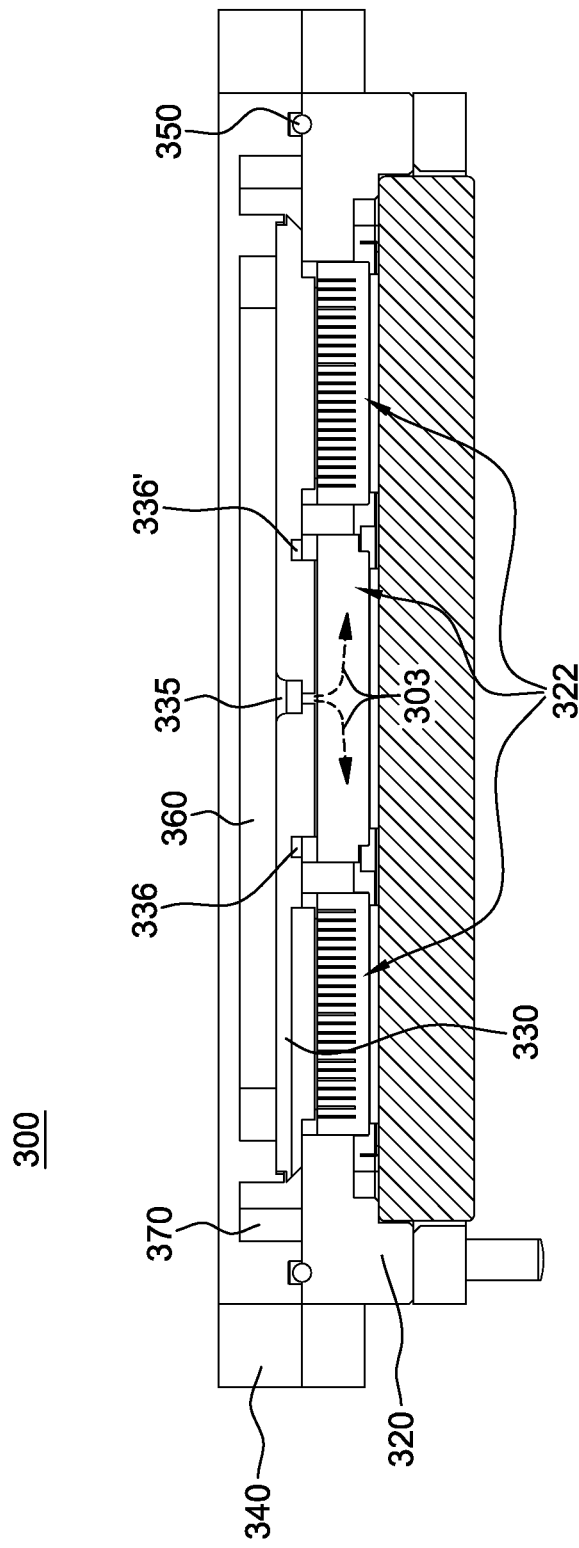
FIG. 9C is a cross-sectional elevational view of the coolant-cooled electronic module of FIG. 9A, taken along line 9C-9C thereof, in accordance with one or more aspects of the present invention.

FIGS. 9A-9C depict the assembled coolant-cooled electronic module 300 of FIGS. 7A-8. Referring collectively to FIGS. 9A-9C, the four electronic components of a four-component assembly are, in one embodiment, each actively liquid-cooled within the coolant-cooled electronic module. As illustrated, each thermally conductive element 322 of the coolant-cooled electronic module 300 has a conduction surface with a similar configuration and surface area to the configuration and surface area of the underlying electronic component to be cooled, and is in good thermal contact therewith via small gap technology (SGT) processing and a thermal interface material such as described above. Coolant enters via coolant inlet port 341 into coolant supply manifold 360, formed between inner manifold element 330 and outer manifold element 340. From coolant supply manifold 360, coolant passes via the coolant supply openings 335, into or onto the coolant-cooled surfaces of the thermally conductive elements 322 in a parallel flow arrangement, that is, in one example only.

In this implementation, coolant impinges on the coolant-cooled surfaces of the thermally conductive elements and bifurcates 303 within the coolant channels to flow to opposite sides of the coolant-cooled surface, where a pair of first and second coolant exhaust channels exhaust the coolant to coolant return manifold 370, for egressing via the coolant outlet port. Note in this example, that the coolant-cooled electronic module 300 is configured such that the outer manifold element 340, module lid assembly 320, and lower support frame 301, align along their edges and are mechanically fastened together to ensure good thermal conduction and fluid-tight sealing between the different components of the electronic module. Note that good thermal contact between the thermally conductive elements (e.g., piston cold plates) and the upper surfaces of the respective electronic components (e.g., integrated circuit chips) can be established using the above-described small gap technology processing, wherein the gap distance between the thermally conductive element and respective electronic component is individually set dependent, for example, on position of the electronic component on the substrate, and the desired thermal interface material to be employed between the two structures. In the example presented herein, the coolant supply openings are slots which extend, for instance, fully across the coolant-cooled surfaces of the thermally conductive elements, and are disposed to introduce coolant orthogonal to the coolant channels defined in the coolant-cooled surfaces of the thermally conductive elements. The coolant supply openings are centered above the center regions of the thermally conductive elements, with (in one embodiment) the first and second coolant exhaust channels disposed parallel to the coolant supply openings or slots at opposite sides of the coolant-cooled surfaces. In this manner, coolant, such as water, is presented with a plurality of equal-length channels upon exiting the channels in the coolant-cooled surfaces, with one half of the channels flowing coolant anti-parallel to the other half (in one embodiment).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to explain the principles of the invention and the practical application, and to enable others of ordinary skill in the art to understand the invention through various embodiments and the various modifications thereto which are dependent on the particular use contemplated.

What is claimed is:

1. A method of fabricating a coolant-cooled electronic module, the method comprising:
   providing a multi-component assembly comprising multiple electronic components disposed on a substrate;
   providing a module lid assembly, the module lid assembly comprising:
      a module lid comprising multiple openings through the module lid aligned over the multiple electronic components of the multi-component assembly;
      multiple thermally conductive elements disposed within the multiple openings in the module lid, each thermally conductive element of the multiple thermally conductive elements comprising a coolant-cooled surface and a conduction surface, the coolant-cooled surface and the conduction surface being opposite surfaces of the thermally conductive element, and the conduction surface being coupled to a respective electronic component of the multiple electronic components of the multi-component assembly;
   disposing an inner manifold element over the module lid assembly, the inner manifold element comprising opposite first and second main surfaces, the first main surface being configured to facilitate flow of coolant onto, at least in part, the coolant-cooled surfaces of the multiple thermally conductive elements, and including coolant supply openings disposed over the coolant-cooled surfaces of the multiple thermally conductive elements, and the first main surface including coolant exhaust channels formed in the first main surface and disposed, at least in part, adjacent to the coolant-cooled surfaces of the multiple thermally conductive elements, the coolant exhaust channels extending outwards towards a respective peripheral side edge of the inner manifold element; and
   disposing an outer manifold element over the inner manifold element and coupled to the module lid, with the inner manifold element being between the outer manifold element and the module lid, wherein the inner manifold element and the outer manifold element define, at least in part, a coolant supply manifold over the second main surface of the inner manifold element, and the outer manifold element and the module lid define, at least in part, a coolant return manifold, the coolant supply openings being in fluid communication with the coolant supply manifold, and the coolant exhaust channels being in fluid communication with the coolant return manifold, and the coolant supply manifold, coolant supply openings, coolant exhaust channels, and coolant return manifold facilitate flow of coolant across the coolant-cooled surfaces of the multiple thermally conductive elements.

2. The method of claim 1, wherein the multiple thermally conductive elements are each sealed along a periphery thereof to the module lid, and wherein each thermally conductive element comprises opposite coolant-cooled and conduction surfaces, with the conduction surface thereof disposed in spaced opposing relation a surface of a respective electronic component of the multiple electronic components, and in thermal contact with the surface of the respective electronic component via a thermal interface material disposed therebetween.

3. A method of fabricating a coolant-cooled electronic module, the method comprising:
provided a multi-component assembly comprising multiple electronic components disposed on a substrate;
providing a module lid assembly, the module lid assembly comprising:
a module lid comprising multiple openings through the module lid aligned over the multiple electronic components of the multi-component assembly;
multiple thermally conductive elements disposed within the multiple openings in the module lid, each thermally conductive element of the multiple thermally conductive elements comprising a coolant-cooled surface and a conduction surface the coolant-cooled surface and the conduction surface being opposite surfaces of the thermally conductive element, and the conduction surface being coupled to a respective electronic component of the multiple electronic components of the multi-component assembly;
disposing, an inner manifold element over the module lid assembly, the inner manifold element comprising opposite first and second main surfaces, the first main surface being configured to facilitate flow of coolant onto, at least in part, the coolant-cooled surfaces of the multiple thermally conductive elements, and including coolant supply openings disposed over the coolant-cooled surfaces of the multiple thermally conductive elements, and the first main surface including coolant exhaust channels and disposed, at least in part, adjacent to the coolant-cooled surfaces of the multiple thermally conductive elements;
disposing an outer manifold element over the inner manifold element and coupled to the module lid, with the inner manifold element being between the outer manifold element and the module lid, wherein the inner manifold element and the outer manifold element define, at least in part, a coolant supply manifold over the second main surface of the inner manifold element, and the outer manifold element and the module lid define, at least in part, a coolant return manifold, the coolant supply openings being in fluid communication with the coolant supply manifold, and the coolant exhaust channels being in fluid communication with the coolant return manifold, and the coolant supply manifold, coolant supply openings, coolant exhaust channels, and coolant return manifold facilitate flow of coolant across the coolant-cooled surfaces of the multiple thermally conductive elements; and
wherein each coolant supply opening of the multiple coolant supply openings is centrally disposed over the coolant-cooled surface of the respective thermally conductive element, and the multiple coolant exhaust channels comprise multiple pairs of first and second coolant exhaust channels, each pair of first and second coolant exhaust channels being disposed, at least in part, adjacent to the coolant-cooled surface of the respective thermally conductive element of the multiple thermally conductive elements at opposite sides thereof to facilitate exhausting of coolant from the coolant-cooled surface.

4. The method of claim 3, wherein each coolant supply opening comprises a coolant supply slot, and the respective pair of first and second coolant exhaust channels are disposed at opposite sides of the coolant-cooled surface of the one thermally conductive element.

5. The method of claim 4, wherein the coolant-cooled surface of each thermally conductive element of the multiple thermally conductive elements comprises a plurality of channels formed therein to facilitate heat transfer from the thermally conductive element to the coolant flowing across the coolant-cooled surface.

6. The method of claim 5, wherein the coolant supply slots are centrally disposed over the respective coolant-cooled surfaces, and each provides a coolant flow onto the respective coolant-cooled surface, which bifurcates into orthogonal coolant flow within the plurality of channels formed in the coolant-cooled surface of the respective thermally conductive element.

7. The method of claim 6, wherein the plurality of channels in the coolant-cooled surface of each thermally conductive element are curved and decrease in cross-sectional flow area from the central region thereof to the opposite sides of the coolant-cooled surface with the pair of first and second coolant exhaust channels disposed adjacent thereto.

8. The method of claim 1, wherein the inner manifold element further comprises a manifold wall extending from the second main surface, and the coolant supply manifold is defined within the manifold wall of the inner manifold element, and the coolant return manifold is defined, at least in part, outside and around the manifold wall of the inner manifold element.

9. The method of claim 8, wherein the coolant supply manifold resides over the multiple openings in the module lid, and the inner manifold element includes multiple lands and the multiple coolant supply openings in the first main surface thereof, the multiple coolant supply openings extending through the multiple lands and the multiple lands being sized and configured to reside over and partially extend into the multiple openings in the module lid to facilitate forming multiple, parallel coolant flow paths across the multiple thermally conductive elements disposed within the multiple openings in the module lid.

10. The method of claim 1, wherein the coolant return manifold is defined, at least in part, around a periphery of the inner manifold element.

11. The method of claim 10, wherein the outer manifold element seals to the module lid, and wherein the coolant supply manifold is defined between a first portion of an inner surface of the outer manifold element and the second main surface of the inner manifold element, and the coolant return manifold is defined, at least in part, by the periphery of the inner manifold element, a second portion of the inner surface of the outer manifold element, and the module lid, and wherein the outer manifold element includes a coolant inlet port in fluid communication with the coolant supply manifold and a coolant outlet port in fluid communication with the coolant return manifold.

12. The method of claim 1, wherein the multi-component assembly is a multichip assembly comprising multiple integrated circuit chips to be cooled disposed on the substrate.

13. The method of claim 11, wherein the inner manifold element further comprises chamfers within the first main surface thereof adjacent, at least in part, to ends of the coolant exhaust channels, where coolant exhausts into the coolant return manifold, the chamfers increase the volume of the coolant exhaust channel adjacent to the coolant return manifold to facilitate flow of coolant into and through the coolant return manifold.

14. A method of fabricating a coolant-cooled electronic module, the method comprising:
- providing a multi-component assembly comprising multiple processor chips disposed on a substrate;
- providing a module lid assembly, the module lid assembly comprising:
  - a module lid comprising multiple openings through the module lid aligned over the multiple processor chips of the multi-component assembly;
  - multiple thermally conductive elements disposed within the multiple openings in the module lid, each thermally conductive element of the multiple thermally conductive elements comprising a coolant-cooled surface and a conduction surface, the coolant-cooled surface and the conduction surface being opposite surfaces of the thermally conductive element, the conduction surface being coupled to a respective processor chip of the multiple processor chips of the multi-component assembly; and
- providing a manifold assembly configured to facilitate coolant flow across the coolant-cooled surfaces of the thermally conductive elements, the manifold assembly comprising:
  - an inner manifold element disposed over the lid assembly, the inner manifold element comprising opposite first and second main surfaces, the first main surface being configured to facilitate flow of coolant onto, at least in part, the coolant-cooled surface of the multiple thermally conductive elements, and including coolant supply openings disposed over the coolant-cooled surfaces of the multiple thermally conductive elements, and the first surface including coolant exhaust channels formed in the first main surface and disposed, at least in part, adjacent to the coolant-cooled surfaces of the multiple thermally conductive elements, the coolant exhaust channels extending outwards towards a respective peripheral side edge of the inner manifold element; and
  - an outer manifold element disposed over the inner manifold element and coupled to the module lid, with the inner manifold element being between the outer manifold element and the module lid, wherein the inner manifold element and the outer manifold element define, at least in part, a coolant supply manifold over the second main surface of the inner manifold element, and the outer manifold element and the module lid define, at least in part, a coolant return manifold, the coolant supply openings being in fluid communication with the coolant supply manifold, and the coolant exhaust channels being in fluid communication with the coolant return manifold, and the coolant supply manifold, the coolant supply openings, the coolant exhaust channels, and the coolant return manifold facilitating flow of coolant across the coolant-cooled surfaces of the multiple thermally conductive elements.

15. The method of claim 14, wherein the multiple thermally conductive elements are each sealed along a periphery thereof to the module lid, and wherein the conduction surface of each thermally conductive element of the multiple thermally conductive elements is in thermal contact with a surface of the respective electronic component of the multiple electronic components via a thermal interface material disposed therebetween.

16. The method of claim 14, wherein each coolant supply opening of the multiple coolant supply openings in the inner manifold element is centrally disposed over the coolant-cooled surface of the respective thermally conductive element, and wherein the multiple coolant exhaust channels comprise multiple pairs of first and second coolant exhaust channels, each pair of first and second coolant exhaust channels being disposed, at least in part, adjacent to the coolant-cooled surface of the respective thermally conductive element of the multiple thermally conductive elements at opposite sides thereof to facilitate exhausting of coolant from that coolant-cooled surface.

17. The method of claim 16, wherein each coolant supply opening comprises a coolant supply slot disposed over a central region of the coolant-cooled surface of the respective thermally conductive element to provide a coolant flow orthogonal to the coolant-cooled surface, and a bifurcated coolant flow across the coolant-cooled surface to the pair of first and second coolant exhaust channels disposed at opposite sides of that coolant-cooled surface.

18. The method of claim 17, wherein the coolant-cooled surface of each thermally conductive element of the multiple thermally conductive elements comprises a plurality of channels formed therein to facilitate heat transfer from the thermally conductive element to coolant flowing across the coolant-cooled surface.

19. The method of claim 18, wherein the plurality of channels in the coolant-cooled surface of each thermally conductive element are curved and decrease in cross-sectional coolant flow area from the central region thereof to the opposite sides of the coolant-cooled surface with the pair of first and second coolant exhaust channels disposed adjacent thereto.

* * * * *